US006499126B1

United States Patent
Tsuto

(12) United States Patent
Tsuto

(10) Patent No.: US 6,499,126 B1
(45) Date of Patent: Dec. 24, 2002

(54) PATTERN GENERATOR AND ELECTRIC PART TESTING APPARATUS

(75) Inventor: Masaru Tsuto, Tokyo (JP)

(73) Assignee: Advantest Corporation, Tokyo (JP)

( * ) Notice: Subject to any disclaimer, the term of this patent is extended or adjusted under 35 U.S.C. 154(b) by 377 days.

(21) Appl. No.: 09/606,082

(22) Filed: Jun. 29, 2000

(30) Foreign Application Priority Data

Jun. 29, 1999 (JP) ............................................ 11-184470

(51) Int. Cl.⁷ .......................... G01R 31/28; G06F 11/00
(52) U.S. Cl. ........................ 714/738; 714/714; 324/73.1
(58) Field of Search ................................ 714/738, 742, 714/743, 718, 720, 739, 726, 727, 744, 724; 365/201; 324/73.1

(56) References Cited

U.S. PATENT DOCUMENTS

| 6,032,281 A | * | 2/2000 | Fujisaki ...................... 714/738 |
| 6,067,651 A | * | 5/2000 | Rohrbaugh et al. .......... 714/738 |
| 6,092,225 A | * | 7/2000 | Gruodis et al. .............. 714/724 |
| 6,161,206 A | * | 12/2000 | Wasson ....................... 714/738 |

* cited by examiner

*Primary Examiner*—Emmanuel L. Moise
(74) *Attorney, Agent, or Firm*—Rosenthal & Osha L.L.P.

(57) ABSTRACT

A pattern generator that generates a test pattern used for testing an electric part including: a pattern memory that stores test pattern information, which defines the test pattern; a vector memory that stores a vector instruction, which indicates an order for reading out the test pattern information from the pattern memory; an address expansion unit that generates an address of the test pattern information in the pattern memory according to the vector instruction stored in the vector memory; an interruption pattern memory that stores interruption test pattern information, which defines the test pattern during a predetermined interruption process; an interruption vector memory, which is different from the vector memory, that stores an interruption vector instruction which indicates an order for reading out the interruption test pattern information from the interruption pattern memory;

an interruption address expansion unit that generates an address of the interruption test pattern information according to the interruption vector instruction stored in the interruption vector memory; and a pattern generating unit that generates the test pattern based on the test pattern information corresponding to the address generated by the address expansion unit or the interruption test pattern information corresponding to the address generated by the interruption address expansion unit.

17 Claims, 15 Drawing Sheets

(A)

| CHACHE ADDRESS |
|---|
| #300 |

~114

(B)

| SEQUENCE INSTRUCTION |
|---|
| NOP |
| STO : NOP |
| NOP |
| NOP |
| JNI STO |
| ... |
| (NOT DEFINE) |

~102

(C)

| ADDRESS | CONTROL INSTRUCTION | |
|---|---|---|
| #0 | XB<0 YB<0 | PAGE-IN |
| #1 | XB<XB+1 | PAGE |
| #2 | XB<XB+1 | PAGE |
| #3 | XB<XB+1 | PAGE-OUT |
| #4 | XB<0 YB<YB+1 | |
| ... | | |
| #300 | RF<RF+1 | REFRESH |

| CYCLE | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| ADDRESS DESIGNATING UNIT AP | #0 | #1 | #2 | #3 | #4 | #1 | #2 | #3 | #4 | #4 | #1 | #2 | #3 | #4 |
| ADDRESS PC | #0 | #1 | #2 | #3 | #4 | #1 | #2 | #3 | #4 | #300 | #1 | #2 | #3 | #4 |
| RESISTOR XB | 0 | 0 | 1 | 2 | 3 | 0 | 1 | 2 | 3 | 0 | 0 | 1 | 2 | 3 |
| RESISTOR YB | 0 | 0 | 0 | 0 | 0 | 1 | 1 | 1 | 1 | 2 | 2 | 2 | 2 | 2 |
| RESISTOR RF | 0 | 0 | 0 | 0 | 0 | 0 | 0 | 0 | 0 | 1 | 0 | 1 | 0 | 1 |
| REF CYCLE | 0 | 0 | 0 | 0 | 0 | 0 | 0 | 0 | 0 | 1 | 0 | 0 | 0 | 0 |
| ADDRESS | XB | YB/XB | XB | XB | XB | YB/XB | XB | XB | XB | RF | YB/XB | XB | XB | XB |
| OPERATION OF DRAM | NON | PAGE-IN | PAGE | PAGE | PAGE-OUT | PAGE-IN | PAGE | PAGE | PAGE-OUT | REFRESH | PAGE-IN | PAGE | PAGE | PAGE |

INTERRUPTION REQUEST ↓ (between cycles 9 and 10)

| SEQUENCE INSTRUCTION |
|---|
| NOP |
| NOP |
| RTN |

40

(B)

| SEQUENCE INSTRUCTION |
|---|
| NOP |
| ST0 : NOP |
| NOP |
| NOP |
| JNI ST0 |
| ... |

30

(C)

| ADDRESS | CONTROL INSTRUCTION | |
|---|---|---|
| #0 | XB<0 YB<0 | |
| #1 | XB<XB+1 | PAGE-IN |
| #2 | XB<XB+1 | PAGE |
| #3 | XB<XB+1 | PAGE |
| #4 | XB<0 YB<YB+1 | PAGE-OUT |
| ... | | |
| #300 | | REF-IN |
| #301 | RF<RF+1 | REFRESH |
| #302 | | REF-OUT |

52

| CYCLE | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| ADDRESS DESIGNATING UNIT AP | #0 | #1 | #2 | #3 | #4 | #4 | #4 | #4 | #1 | #2 | #3 | #4 | #1 | #2 |
| ADDRESS RAP | #300 | #300 | #300 | #300 | #300 | #300 | #301 | #302 | #300 | #300 | #300 | #300 | #300 | #300 |
| ADDRSSS PC | #0 | #1 | #2 | #3 | #4 | #300 | #301 | #302 | #1 | #2 | #3 | #4 | #1 | #2 |
| RESISTOR XB | 0 | 0 | 1 | 2 | 3 | 0 | 0 | 0 | 0 | 1 | 2 | 3 | 0 | 1 |
| RESISTOR YB | 0 | 0 | 0 | 0 | 0 | 1 | 1 | 1 | 1 | 1 | 1 | 1 | 2 | 2 |
| RESISTOR RF | 0 | 0 | 0 | 0 | 0 | 0 | 0 | 1 | 0 | 0 | 0 | 0 | 1 | 1 |
| REF CYCLE | | | | | | (RF) | RF | YB | YB/XB | XB | XB | XB | YB/XB | XB |
| ADDRESS | XB | YB/XB | XB | XB | XB | REF-IN | REFRESH | REF-OUT | PAGE-IN | PAGE | PAGE | PAGE-OUT | PAGE-IN | PAGE |
| OPERATION OF DRAM | NON PAGE-IN | PAGE | PAGE | PAGE | PAGE-OUT | REF-IN | REFRESH | REF-OUT | PAGE-IN | PAGE | PAGE | PAGE-OUT | PAGE-IN | PAGE |

(A) 30 — SEQUENCE INSTRUCTION: NOP, JSR, NOP, NOP, JSR, NOP, ...

(B) 40 — SEQUENCE INSTRUCTION: NOP, NOP, RTN (C) 60 —
| ADDRESS | PATTERN |
|---|---|
| #0 | PAT-1 |
| #1 | PAT-2 |
| #2 | PAT-3 |
| #3 | PAT-4 |
| #4 | PAT-5 |
| #5 | PAT-6 |
| ... | ... |
| #300 | SPAT-1 |
| #301 | SPAT-2 |
| #302 | SPAT-3 |

Figure 12:
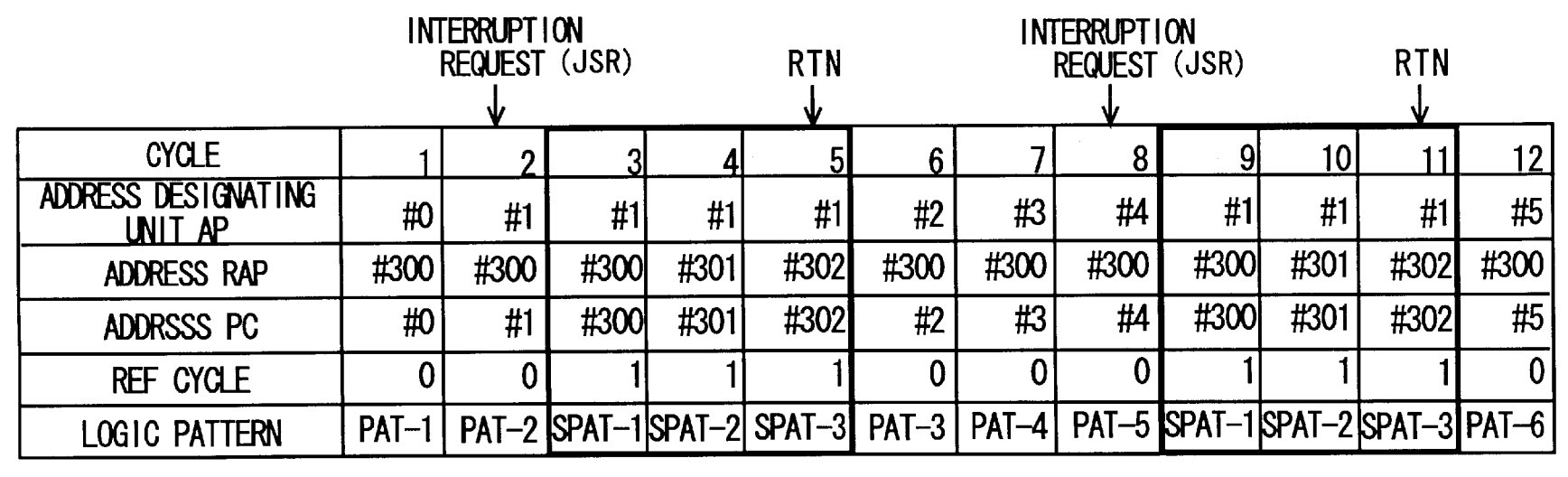

| CYCLE | 1 | 2 | 3 | 4 | 5 | 6 | 7 | 8 | 9 | 10 | 11 | 12 |
|---|---|---|---|---|---|---|---|---|---|---|---|---|
| ADDRESS DESIGNATING UNIT AP | #0 | #1 | #1 | #1 | #1 | #2 | #3 | #4 | #1 | #1 | #1 | #5 |
| ADDRESS RAP | #300 | #300 | #300 | #301 | #302 | #300 | #300 | #300 | #300 | #301 | #302 | #300 |
| ADDRSSS PC | #0 | #1 | #300 | #301 | #302 | #2 | #3 | #4 | #300 | #301 | #302 | #5 |
| REF CYCLE | 0 | 0 | 1 | 1 | 1 | 0 | 0 | 0 | 1 | 1 | 1 | 0 |
| LOGIC PATTERN | PAT-1 | PAT-2 | SPAT-1 | SPAT-2 | SPAT-3 | PAT-3 | PAT-4 | PAT-5 | SPAT-1 | SPAT-2 | SPAT-3 | PAT-6 |

| SEQUENCE INSTRUCTION | 30 |
|---|---|
| NOP |  |
| JSR |  |
| NOP |  |
| NOP |  |
| NOP |  |
| NOP |  |

(B)

| SEQUENCE INSTRUCTION | 40 |
|---|---|
| NOP |  |
| STO : NOP |  |
| NOP |  |
| NOP |  |
| JNI STO |  |
| RTN |  |

(C) 60

| ADDRESS | PATTERN |
|---|---|
| #0 | PAT-1 |
| #1 | PAT-2 |
| #2 | PAT-3 |
| #3 | PAT-4 |
| #4 | PAT-5 |
| #5 | PAT-6 |

(D) 52

| ADDRESS | CONTROL INSTRUCTION |
|---|---|
| #0 | XB<0  YB<0 |
| #1 | XB<XB+1 |
| #2 | XB<XB+1 |
| #3 | XB<XB+1 |
| #4 | XB<0  YB<YB+1 |
| #5 |  |

| CYCLE | 1 | 2 | 3 | 4 | 5 | ... | 11 | 12 | 13 | 14 | 15 | 16 |
|---|---|---|---|---|---|---|---|---|---|---|---|---|
| ADDRESS DESIGNATING UNIT AP | #0 | #1 | #1 | #1 | #1 | ... | #1 | #1 | #2 | #3 | #4 | #5 |
| ADDRESS RAP | #0 | #0 | #0 | #1 | #2 | ... | #4 | #5 | #5 | #5 | #5 | #5 |
| REF CYCLE | 0 | 0 | 1 | 1 | 1 | ... | 1 | 1 | 0 | 0 | 0 | 0 |
| PATTERN | LOGIC | LOGIC | MEMORY | MEMORY | MEMORY | ... | MEMORY | MEMORY | LOGIC | LOGIC | LOGIC | LOGIC |

Interruption request (JSR) at cycle 2.

*FIG. 15*

PATTERN GENERATOR AND ELECTRIC PART TESTING APPARATUS

This patent application claims priority based on a Japanese patent application, H11-184470 filed on Jun. 29, 1999, the contents of which are incorporated herein by reference.

BACKGROUND OF THE INVENTION

1. Field of the Invention

The present invention relates to a pattern generator and an electric part testing apparatus which generates a test pattern used for testing an electric part.

2. Description of the Related Art

Conventionally, an electric part testing apparatus used for testing an electric part such as semiconductor memory comprises a pattern generator, which generates a test pattern used for testing an electric part. FIG. 1 shows a configuration of a conventional pattern generator. A pattern generator 100 generates a test pattern for a dynamic random access memory (DRAM), which is an example of an electric part.

A pattern generator 100 has a vector memory 102, a read out controller 103, a vector cache memory 104, an address expansion unit 106, an address designating unit (AP) 108, a timer 110, an interruption controller 112, a refresh address-designating unit (SPI) 114, a multiplexer (MUX) 116, and a pattern-generating unit 118. A timer 110 generates an interruption request for every predetermined time interval. The interruption controller 112 sets a refresh cycle signal (REF CYCLE) to "1" and outputs to an address expansion unit 106 and a multiplexer 116 on receipt of the interruption request from the timer 110.

The vector memory 102 is constituted by a mass storage static random access memory, SRAM, and stores a vector instruction (sequence instruction) that defines an order for reading out a control instruction, which defines a test pattern to be generated.

The read out controller 103 inputs a part of the vector instruction from the vector memory 102 and outputs the input vector instruction to the vector cache memory 104. The vector cache memory 104 is constituted by a small storage high speed SRAM, and stores a vector instruction input from the read out controller 103. Furthermore, the vector cache memory 104 outputs the vector instruction to the address expansion unit 106 based on the address, which is input from the address-designating unit 108.

The address expansion unit 106 generates an address by interpreting the vector instruction input from the vector cache memory 104 and outputs the generated address to the address-designating unit 108. Moreover, the address expansion unit 106 interrupts the generation of the address when the refresh cycle signal, which is set to "1", is input from the interruption controller 112. The address expansion unit 106 restarts the generation of the address when the refresh cycle signal, which is set to "0", is input from the interruption controller 112. The address-designating unit 108 stores and outputs the address input from the address expansion unit 106.

The refresh address-designating unit 114 stores and outputs an address, which corresponds to the control instruction for refreshing an electric part. The multiplexer 116 selects either the address input from the interruption controller 112 or the address input from the refresh address-designating unit 114, based on the refresh cycle signal input from the interruption controller 112. The address input from the refresh address-designating unit 114 is selected when the refresh cycle is "1", and the address input from the address-designating unit 108 is selected when the refresh cycle signal is "0".

The pattern-generating unit 118 has a control instruction memory 120, pattern operator 122, a resistor XB, a resistor YB, and a resistor RF. The control instruction memory 120 stores a control instruction, which generates a test pattern, and outputs the control instruction corresponding to the address, which is input from the multiplexer 116, to pattern operator 122. The resistor XB stores a value to be provided as a column address of a DRAM, which is an object to be tested. The resistor YB stores a value to be provided as a row address of the DRAM, and the resistor RF stores a row address for refreshing the DRAM. The pattern operator 122 generates a test pattern based on the control instruction output from the control instruction memory 120. Example of test patterns include, an address signal, a Row Address Strobe (RAS) signal, a Column Address Strobe (CAS) signal, a data signal, and a write enable (/WE: where "/" stands for reverse logic) signal.

FIG. 2 shows various kinds of information stored in the conventional pattern generator. FIG. 2(A) shows an address stored in the refresh address-designating unit 114. The refresh address-designating unit 114 stores "1#300" as an address corresponding to the refresh controlling instruction. FIG. 2(B) shows a sequence instruction stored in the vector memory 102. In FIG. 2(B), "NOP" is an instruction that outputs the present address value and advances the address value to the next value, that is, adds "1" to the present address value. "JNI STO" is an instruction that outputs the present address value and executes the instruction of the address, which is allotted a label STO.

FIG. 2(C) shows a part of a control instruction stored in the control-instruction memory 118. In FIG. 2(C), "XB<0" is an instruction that clears the value of the resistor XB to "0" in the next cycle. "XB<XB+1" is an instruction that adds "1" to the value of the resistor XB in the next cycle. "YB<0" is an instruction that clears the value of the resistor YB to "0" in the next cycle. "YB<YB+1" is an instruction that adds "1" to the value of the resistor YB in the next cycle. "RF<RF+1" is an instruction that adds "1" to the value of the resistor RF in the next cycle.

"PAGE-IN" is an instruction that outputs a signal to the DRAM for inputting a row address and a column address, which executes the data writing process or data reading process. For example, "PAGE-IN" is an instruction that outputs the value of the resistor YB as an address signal and outputs a RAS signal, which is set to LOW, and also outputs the value of the resistor XB as an address signal and outputs the CAS signal, which is set to a negative pulse. "PAGE" is an instruction that outputs the signal to the DRAM for changing a column address, which executes the data writing process or data reading process. For example, "PAGE" is an instruction that outputs the value of the resistor as an address signal and outputs the CAS signal, which is set to a negative pulse.

"PAGE-OUT" is an instruction that outputs a signal to the DRAM for terminating the data reading process or data writing process. For example, "PAGE-OUT" is an instruction that outputs the value of the resistor XB as an address signal, and a CAS signal which is set to a negative pulse, and also outputs the RAS signal, which is set to HIGH. By setting the RAS signal to HIGH, the DRAM is pre-charged. That is, the wiring capacity of the DRAM is charged. "REFRESH" is an instruction that outputs a signal for executing the refreshing operation on the DRAM. For example, "REFRESH" is an instruction that outputs the value of the resistor RF as an address signal and outputs a RAS signal, which is set to LOW.

FIG. 3 shows an operation of the conventional pattern generator. FIG. 3 shows an operation of the pattern generator 100 when the several kinds of information shown in FIG. 2 are stored in the pattern generator. FIG. 3(A) shows a value of an address output from the address-designating unit 108, a value of the address PC output from the multiplexer 116, the value of the resistor XB, the value of the resistor YB, the value of the resistor RF, the value of the refresh cycle (REFCYCLE), the operation of the resistor, which is a provider of the address output to the DRAM, and the operation of the DRAM for each cycle during the operation of the pattern generator. FIG. 3(B) shows a signal, which is output to the DRAM from the pattern generator, from the cycle 6 to cycle 11.

In the cycle 1, the address expansion unit 106 picks out "NOP" from the vector cache memory 104, directs the address-designating unit 108 to output the present address value "#0", and sets the address value to "#1". Here, the refresh cycle signal "#0" is output from the interruption controller 112. The multiplexer 116 outputs "#0", which is output from the address-designating unit 108, as an address PC to the pattern-generating unit 118 because the refresh cycle signal is "0". Thereby the instruction "XB<0", "YB<0"is output to the pattern operator 122 from the control instruction memory 120. Therefore, the pattern operator 122 sets the values of the resistor XB and the resistor YB to "0" in the next cycle.

In the cycle 2, the address expansion unit 106 picks out "NOP" from the vector cache memory 104, directs the address-designating unit 108 to output the present address value "#1", and sets the address value to "#2". Here, the refresh cycle signal of "0" is output from the interruption controller 112. The multiplexer 116 outputs "#1", which is output from the address-designating unit 108, as an address PC to the pattern-generating unit 118 because the refresh cycle signal is "0". Thereby the instruction "XB<XB+1", "PAGE-IN" is output to the pattern operator 122 from the control instruction memory 120.

The pattern operator 122 outputs the value of the resistor YB as an address signal, and the RAS signal which is set to LOW, and then outputs the value of the resistor XB as an address signal, and the CAS signal, which is set to a negative pulse. The DRAM thereby executes the PAGE-IN operation. Moreover, the pattern operator 122 adds "1" onto the value of the resistor XB in the next cycle. The same operations shown above are executed from the cycle 3 to cycle 9.

For example, as shown in FIG. 3(B), in the cycle 6, the pattern operator 122 outputs the value of the resistor YB as an address signal and outputs the RAS signal, which is set to LOW., The pattern operator 122 then outputs the value of the resistor XB as an address signal and outputs the CAS signal, which is set to be a negative pulse. The DRAM thereby executes the PAGE-IN operation, that is, the writing process or the reading process of the memory cell corresponding to the column of the value of the resistor XB and the row of the value of the resistor YB.

As shown in FIG. 3(B), in the cycle 7, the pattern operator 122 outputs the value of the resistor XB as an address signal and outputs the CAS signal, which is set to be a negative pulse. The DRAM thereby executes the PAGE operation, that is, the writing process or the reading process of the memory cell corresponding to the column of the value of the resistor XB and the row of the value of the resistor YB, which is input in the cycle 6. The cycle 8 also executes the same operation as shown above.

In the cycle 9, the pattern operator 122 outputs the value of the resistor XB as an address signal, the CAS signal, which is set to be a negative pulse, and then the RAS signal, which is set to HIGH. The DRAM thereby executes the PAGE-OUT operation, that is, the writing process or the reading process of the memory cell corresponding to the column of the value of the resistor XB and the row of the value of the resistor YB, which is input in the cycle 6. The DRAM is thereby pre-charged.

Here, if the timer 110 detects the passing of the predetermined time at the cycle 9, the time for executing the refreshing operation is indicated, and therefore the timer 110 outputs the interruption request to the interruption controller 112. The interruption controller 112 sets the refresh cycle signal to "1" and outputs the refresh cycle signal to the address expansion unit 106 and the multiplexer 116 in the next cycle 10.

In the cycle 10, because the refresh cycle signal is "1", the address expansion unit 106 makes the address-designating unit 108 hold the present address value and stops the generation of an address generated by the vector instruction. Furthermore, because the refresh cycle signal is "1", the multiplexer 116 outputs the address "1#300", which is output from the refresh address-designating unit (SPI) 114, to the pattern-generating unit 118 as an address PC.

Thereby, the control instruction memory 120 inputs "RF<RF+1" and "REFRESH" to the pattern operator 122. Additionally, as shown in FIG. 3, the pattern operator 122 outputs the value of the resistor RF as an address signal and outputs the RAS signal, which is set to LOW. As a result, the DRAM executes the REFRESH operation, that is, refreshing the row value of the resistor RF. Furthermore, the interruption controller 112 changes the row address, which is to be refreshed in the next cycle, by adding "1" onto the value of the resistor RF in the next cycle 11.

In the cycle 11, the interruption controller 112 sets the refresh cycle signal to "0" and outputs the refresh cycle signal to the address expansion unit 106 and the multiplexer 116. The address expansion unit 106 thereby restarts the generation of the address by the vector instruction. Moreover, the multiplexer 116 outputs the address, which is output from the address-designating unit 108, to the pattern-generating unit 118 as an address PC. Then the control instruction memory 120 provides to the pattern operator 122, the control instruction-corresponding to the address provided from the multiplexer 116. The pattern operator 122 generates the test pattern according to the control instruction. The following cycles are executed as shown above.

The conventional electric part testing apparatus can perform predetermined testing of an electric part as expected, when the interruption request is generated by the timer 110 at the cycle of the PAGE-OUT, for example, cycle 9. However, because the interruption request generated by the timer 110 is a synchronous with the testing of the electric part, the interruption request may be generated during the cycle of the PAGE-IN and the cycle of the PAGE. Therefore, problems, which hinder the testing, may occur. For example, the refreshing operation may be executed without pre-charging the electric part, and thus the writing process or the reading process cannot be executed properly after the refreshing operation during the testing of the electric part.

Furthermore, in a case of making subroutine a set of a plurality of instructions executed repeatedly, there is a problem where it is difficult to control when and how this subroutine is read from the vector memory 102 to the cache. Also there is a problem where the configuration of the pattern generator becomes complicated in order to solve the above problem. Furthermore, it is difficult to generate a test pattern, which is to be provided to each of the configuration, cooperatively when the pattern generator generates the pattern for testing the device, on which a memory and a logic are mounted together. Even if the pattern can be generated cooperatively, the configuration of the pattern generator becomes complicated.

SUMMARY OF THE INVENTION

Therefore, it is an object of the present invention to provide a pattern generator and an electric part testing apparatus which overcomes the above issues in the related art. This object is achieved by combinations described in the independent claims. The dependent claims define further advantageous and exemplary combinations of the present invention.

According to the first aspect of the present invention, a pattern generator that generates a test pattern used for testing an electric part can be provided. The pattern generator may comprise: a pattern memory that stores test pattern information, which defines the test pattern; a vector memory that stores a vector instruction, which indicates an order for reading out the test pattern information from the pattern memory; an address expansion unit that generates an address of the test pattern information in the pattern memory according to the vector instruction stored in the vector memory; an interruption pattern memory that stores interruption test pattern information, which defines the test pattern during a predetermined interruption process; an interruption vector memory, which is different from the vector memory, that stores an interruption vector instruction which indicates an order for reading out the interruption test pattern information from the interruption pattern memory; an interruption address expansion unit that generates an address of the interruption test pattern information according to the interruption vector instruction stored in the interruption vector memory; and a pattern generating unit that generates the test pattern based on the test pattern information corresponding to the address generated by the address expansion unit or the interruption test pattern information corresponding to the address generated by the interruption address expansion unit.

The pattern generator may further comprises: an interruption detecting unit that detects a point in time for starting the interruption process; and the interruption address expansion unit generates the address of the interruption test pattern information based on detection of the point in time for starting the interruption process by the interruption detecting unit; and the pattern generating unit generates the test pattern based on the test pattern information corresponding to the address generated by the address expansion unit when the interruption detecting unit does not detect the point in time for starting the interruption process, and the pattern generating unit generates the test pattern based on the interruption test pattern information corresponding to the address generated by the interruption address expansion unit when the interruption detecting unit detects the point in time for starting the interruption process.

The pattern generator may further comprises: an interruption controller that interrupts generation of the address generated by the address expansion unit based on detection of the point in time for starting the interruption process by the interruption detecting unit; an interruption end detecting unit that detects an end of the interruption process; and a starting controller that starts generation of the address by the address expansion unit based on detection of the end of the interruption process by the interruption end detecting unit.

The electric part may be a memory having a function of storing data and which requires refreshing in order to hold the data, and the interruption pattern memory may store the interruption test pattern information, which defines a test pattern for refreshing the memory. The interruption pattern memory may further store the interruption test pattern information that defines a test pattern for pre-charging the memory and a test pattern for providing a column address, which is provided to the memory before executing the interruption process, to the memory; the pattern generating unit may generate the test pattern in an order of: the test pattern for pre-charging the memory, the test pattern for refreshing the memory, and the test pattern for providing the column address when the interruption detecting unit detects the point in time for starting the interruption process.

The pattern generator may further comprise a timer for measuring time, and the interruption detecting unit detects the point in time for starting the interruption process based on the time measured by the timer. The vector instruction, which is stored in the vector memory, may include a description that indicates the point in time for starting the interruption process; and the interruption detecting unit detects the point in time for starting the interruption process based on the description. Each of the test pattern information and the interruption test pattern may be the test pattern, or a control instruction for generating the test pattern. One of the test pattern information and the interruption test pattern information may be the test pattern; and another thereof may be a control instruction for generating the test pattern.

The test pattern information and the interruption test pattern information may be stored on a single memory space corresponding to the addresses which are different from each other; and the pattern generating unit may include: an address selecting unit that selects the address generated by the address expansion unit when the interruption detecting unit does not detect the point in time for starting the interruption process and selects the address generated by the interruption address expansion unit when the interruption detecting unit detects the point in time for starting the interruption process; and a unified pattern generating unit that generates the test pattern based on the test pattern information or the interruption test pattern information corresponding to the address selected by the address selecting unit.

The pattern generator may include: a first pattern generating unit that generates the test pattern based on the test pattern information corresponding to the address generated by the address expansion unit; a second pattern generating unit that generates the test pattern based on the interruption test pattern corresponding to the address generated by the interruption address expansion unit; and a test pattern selecting unit that selects the test pattern generated by the first pattern generating unit when the interruption detecting unit does not detect the point in time for starting the interruption process, and selects the test pattern generated by the second pattern generating unit when the interruption detecting-unit detects the point in time for starting the interruption process.

According to the second aspect of the present invention, an electric part testing apparatus for testing an electric part can be provided. The electric part testing apparatus may comprise: a pattern memory that stores test pattern information that defines a test pattern including an input test pattern provided to the electric part for the testing, and an expected value, which is expected to be output from the electric part after providing the input test pattern to the electric part; a vector memory that stores a vector instruction, which indicates an order for reading out the test pattern information from the pattern memory; an address expansion unit that generates an address of the best pattern information in the pattern memory according to the vector instruction stored in the vector memory; an interruption pattern memory that stores interruption test pattern information, which defines the test pattern during a predetermined interruption process; an interruption vector memory that stores an interruption vector instruction, which indicates an order for reading out the interruption test pattern information from the interruption pattern memory; an interruption address expansion unit that generates an address of the interruption test pattern information in the interruption pattern memory according to the interruption vector instruction stored in the interruption vector memory; a pattern generating unit that generates the test pattern based on the test pattern information corresponding to the address generated by the address expansion unit or the interruption test pattern information corresponding to the address generated by the interruption address expansion unit; a pin data selector that rearranges the test pattern generated by the pattern generating unit according to a pin arrangement of electric terminals of the electric part; a waveform formatter that formats a waveform of the input test pattern, which is included in the test pattern output from the pin data selector; a device socket that provides the input test pattern formatted by the waveform formatter to the electric part and receives an output signal output from the electric part; and a comparator that compares the output signal, which is received by the device socket, with the expected value.

The electric part testing apparatus may further comprise: an interruption detecting unit that detects a point in time for starting the interruption process; and the interruption address expansion unit generates the address of the interruption test pattern information based on detection of the point in time for starting the interruption process by the interruption detecting unit; and the pattern generating unit generates the best pattern based on the test pattern information corresponding to the address generated by the address expansion unit when the interruption detecting unit does not detect the point in time for starting the interruption process, and the pattern generating unit generates the test pattern based on the interruption test pattern information corresponding to the address generated by the interruption address expansion unit when the interruption detecting unit detects the point in time for starting the interruption process.

The electric part testing apparatus may further comprise: an interruption controller that interrupts generation of the address generated by the address expansion unit based on detection of the point in time for starting the interruption process by the interruption detecting unit; an interruption end detecting unit that detects an end of the interruption process; and a starting controller that starts generation of the address by the address expansion unit based on detection of the end of the interruption process by the interruption end detecting unit.

The electric part may be a memory having a function of storing data and which requires refreshing in order to hold the data, and the interruption pattern memory stores the interruption test pattern information, which defines a test pattern for refreshing the memory. The interruption pattern memory may further store the interruption test pattern information that defines a test pattern for pre-charging the memory and a test pattern for providing a column address, which is provided to the memory before executing the interruption process, to the memory; the pattern generating unit may generate the test pattern in an order of: the test pattern for pre-charging the memory, the test pattern for refreshing the memory, and the test pattern for providing the column address to the memory when the interruption detecting unit detects the point in time for starting the interruption process.

According to the third aspect of the present invention, a method for generating a test pattern used for testing an electric part can be provided. The method may include: generating test pattern information, which defines the test pattern; generating a vector instruction, which indicates an order for reading out the test pattern information; generating an address of the test pattern information according to the vector instruction; generating interruption test pattern information, which defines the test pattern during a predetermined interruption process; generating an interruption vector instruction, which indicates an order for reading out the interruption test pattern information; generating an address of the interruption test pattern information according to the interruption vector instruction; and generating the test pattern based on the test pattern information corresponding to the address generated by the generating the address of the test pattern information or the interruption test pattern information corresponding to the address generated by the generating the address of the interruption test pattern information.

This summary of the invention does not necessarily describe all necessary features of the present invention. The present invention may also be a sub-combination of the above described features. The above and other features and advantages of the present invention will become more apparent from the following description of embodiments taken in conjunction with the accompanying drawings.

BRIEF DESCRIPTION OF THE DRAWINGS

FIG. 2 shows various kinds of information stored in the conventional pattern generator.

FIGS. 6(A,B,C) shows various kind of information stored in the pattern generator according to the first embodiment of the present invention.

FIGS. 11(A,B,C) shows various kinds of information stored in the pattern generator according to the second embodiment of the present invention.

FIG. 12 shows an example of the operation of the pattern generator according to the second embodiment of the present embodiment.

FIGS. 14(A,B,C) shows various kinds of information stored in the pattern generator according to the third embodiment of the present invention.

FIG. 15 shows an example of the operation of the pattern generator according to the third embodiment of the present embodiment.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
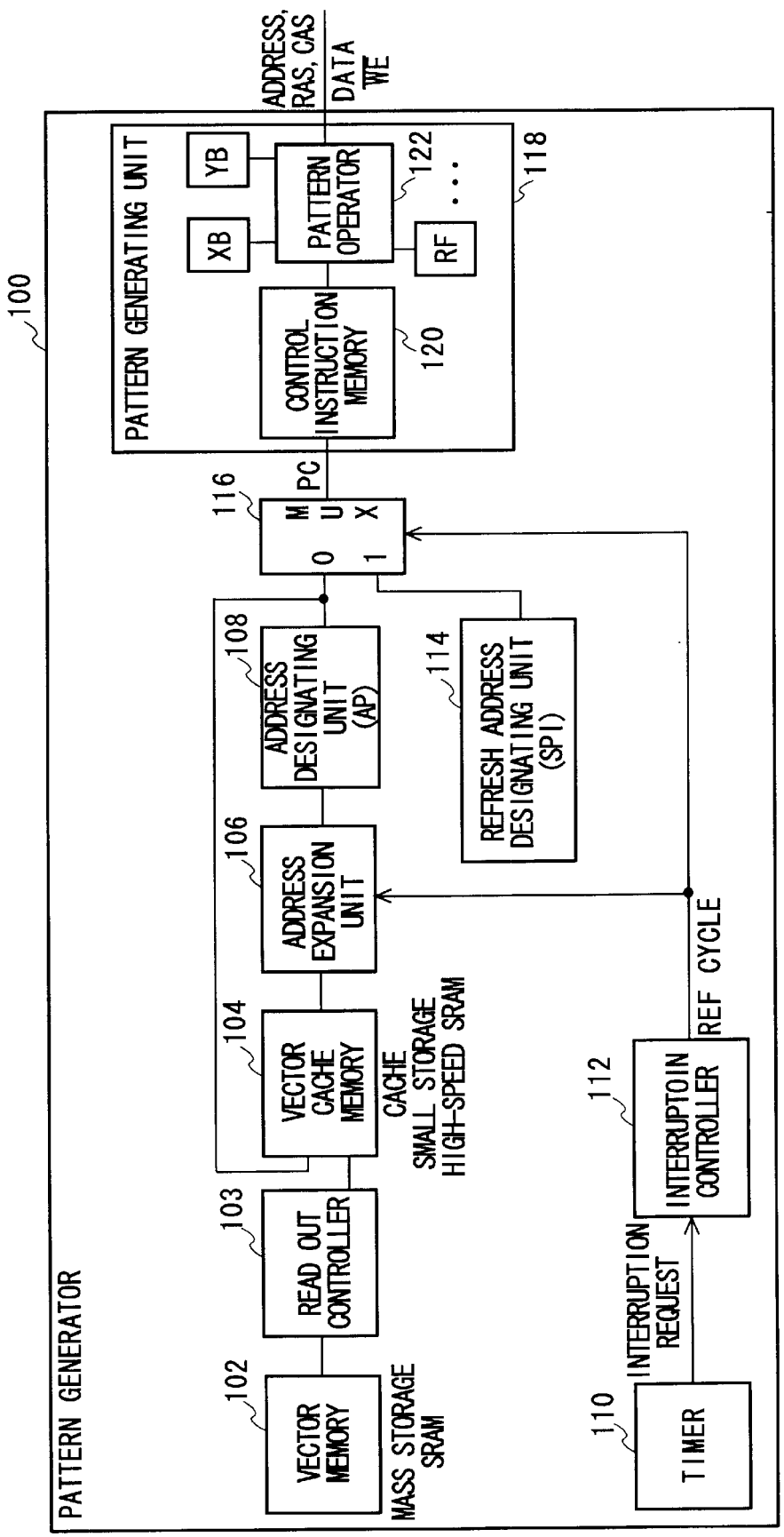
FIG. 1 shows a configuration of a conventional pattern generator.
Figure 3:
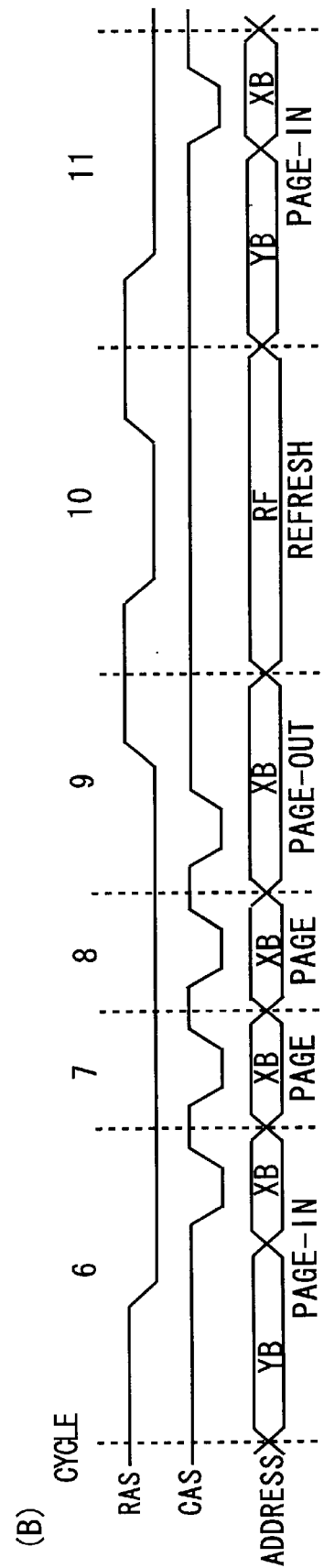
FIGS. 3(A,B) shows an operation of the conventional pattern generator.
Figure 4:
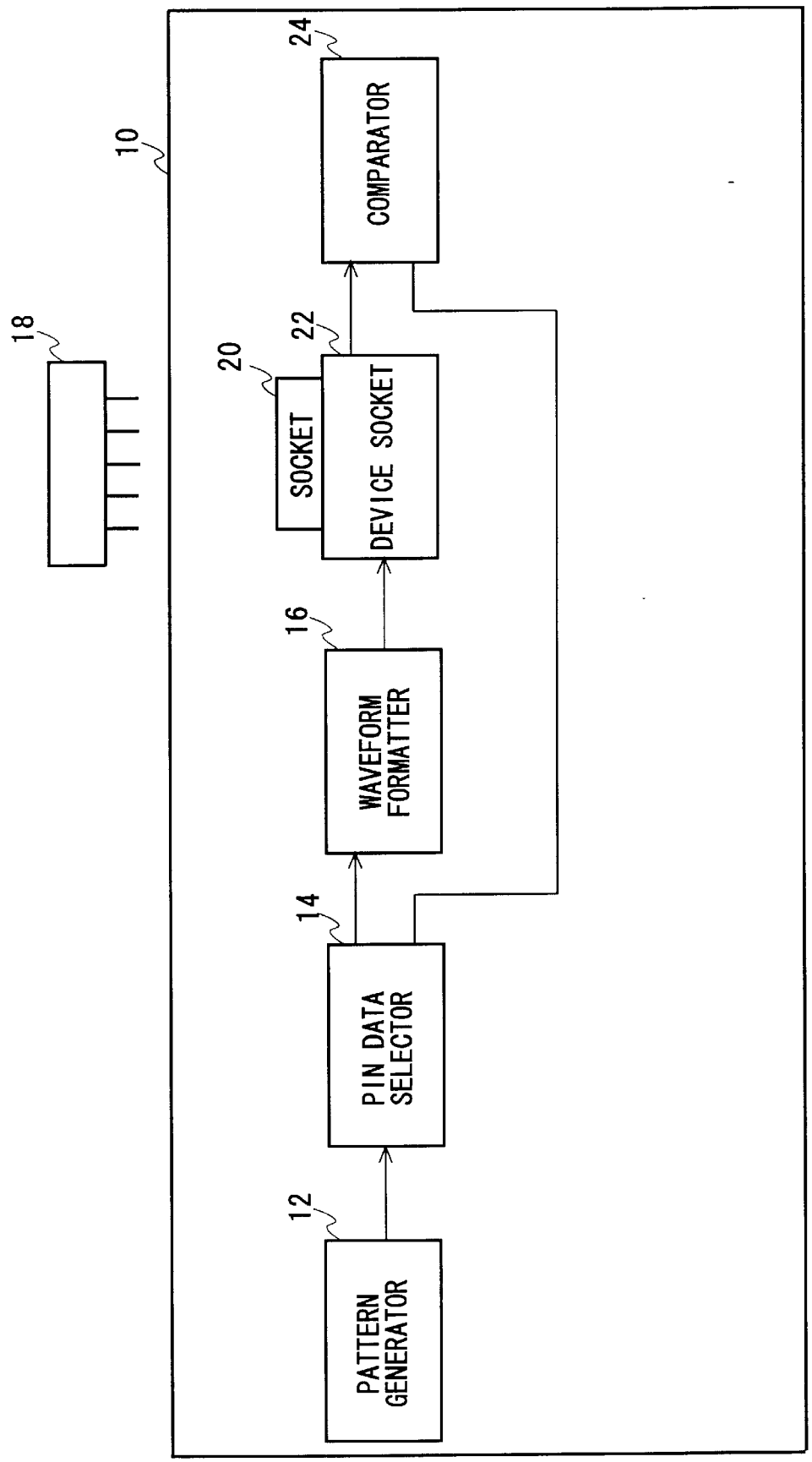
FIG. 4 shows a configuration of an electric part testing apparatus according to the present embodiment.

FIG. 4 shows a configuration of an electric part testing apparatus according to the present embodiment. The electric part testing apparatus 10 comprises a pattern generator 12, a pin data selector 14, a waveform formatter 16, a device socket 22 having a socket 20 into which an electric part 18 can be inserted, and a comparator 24.

Here, "electric part" is apart for executing a predetermined action according to an electric current and voltage. For example, "electric part" includes not only a semiconductor part, which is constituted by an active element such as an IC, Integrated Circuit, or an LSI, Large Scale Integrated circuit, but also includes passive elements such as various kinds of sensors. Furthermore, an electric part includes a part, which contains the parts shown above connected with each other in one package, and a part such as a bread board, which realizes the predetermined function by mounting the parts shown above on a printed board.

The pattern generator 12 outputs an input test pattern, which is to be provided to the electric part 18 for an electric test, and outputs a test pattern signal, which is a signal of a test pattern having an expectation value pattern, to the pin data selector 14. The expectation value pattern is a pattern to be output from the electric part 18 when providing said input test pattern to a normal electric part 18. The pin data selector 14 rearranges the physical position of the input test pattern in the test pattern signal output from the pattern generator 12 according to the arrangement of the electric terminals of the electric part 18, and outputs the input test pattern to the waveform formatter 16. The pin data selector 14 also outputs the expectation value of the test pattern signal to the comparator 24. The waveform formatter 16 formats the waveform of the input test pattern output from the pin data selector 14 to the predetermined waveform, and outputs the input test pattern to the device socket 22.

The device socket 22 provides the input test pattern output from the waveform formatter 16 to the input terminal of the electric part 18, which is inserted into the socket 20. Thereby, the electric part 18 operates according to the test pattern input from the input terminal, based on the actual function of the electric part 18. For example, the electric part 18 outputs an output pattern to the device socket 22 from a predetermined output terminal. The device socket 22 transfers the output pattern input from the output terminal of the electric part 18, which is inserted into the socket 20, to the comparator 24.

The comparator 24 compares the output pattern, which is output from the device socket 22, and the expectation value pattern transferred from the pin data selector 14. The comparator 24 judges that the electric part 18 operates normally when the output pattern matches the expectation value and judges that the electric part 18 does not operates normally when the output pattern does not match with the expectation value pattern.

Figure 5:
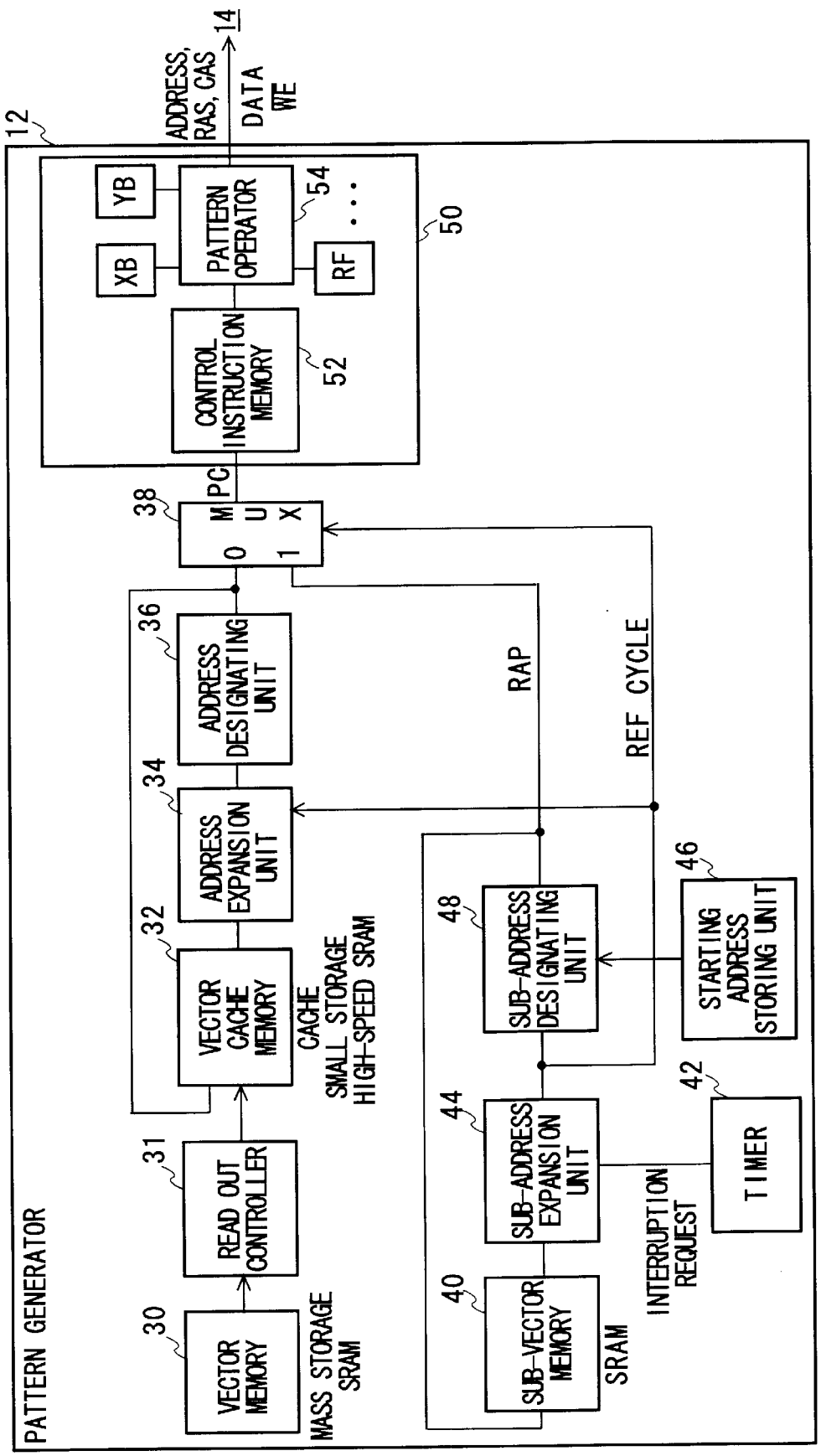
FIG. 5 shows a configuration of the pattern generator according to the first embodiment of the present invention.

FIG. 5 shows a configuration of the pattern generator according to the first embodiment of the present invention. The pattern generator 12 shown in FIG. 5 generates a test pattern for testing a dynamic random access memory (DRAM), which is as an example of an electric part 18. The pattern generator 12 has a vector memory 30, a read out controller 31, a vector cache memory 32, an address expansion unit 34, an address-designating unit 36, a multiplexer 38, a sub-vector memory 40, a timer 42, a sub-address expansion unit 44, a starting address storing unit 46, a sub-address designating unit 48, and a pattern generating unit 50.

The timer 42 generates an interruption request for every predetermined time interval. The sub-vector memory 40 is constituted by for example an SRAM, which can execute the reading and writing operation a thigh speed, and stores a vector instruction that defines an order of the control instruction, which is an example of the test pattern information used during the execution of the refreshing operation. The sub-address expansion unit 44 inputs the vector instruction from the sub-vector memory 40, generates an address by interpreting the vector instruction, and outputs the generated address to the sub-address designating unit 48.

Furthermore, the sub-address expansion unit 44 sets are fresh cycle signal to "1" until the refreshing process, which generates the test pattern used for the refreshing process as an example of the interruption process, finishes when receiving the interruption request from the timer 42, and outputs to the address expansion unit 34 and the multiplexer 38. In other cases, the sub-address expansion unit 44 sets the refresh cycle signal to "0" and outputs to the address expansion unit 34 and the multiplexer 38.

The starting address storing unit 46 stores a starting address that is ahead of the address in the control instruction memory 52, which stores the control instruction for the refreshing process. In the present embodiment, the starting address storing unit 46 stores a starting address such as "#300". The sub-address designating unit 48 adds the address, which is input from the sub-address expansion unit 44, to the starting address, which is stored in the starting address-storing unit 46, and outputs this to the multiplexer 38. The vector memory 30 is constituted by for example mass storage DRAM, and stores the vector instruction which defines the order of test pattern information that is to be used.

The read out controller 31 inputs a part of the vector instruction from the vector memory 30 and outputs the vector instruction to the vector cache memory 32. The vector cache memory 32 is constituted for example an SRAM, which has a small storage capacity, executes the reading and writing operation at high speed, and stores the vector instruction input from the readout controller 31. Furthermore, the vector cache memory 32 outputs the vector instruction to the address expansion unit 34 based on the address input from the address-designating unit 36. The address expansion unit 34 inputs the vector instruction from the vector cache memory 32, generates an address by interpreting the vector instruction input from the vector cache memory 32 and outputs the generated address to the address-designating unit 36.

Moreover, the address expansion unit 34 temporarily interrupts the generation of an address when the refresh cycle signal, which is set to "1", is input from the sub-address expansion unit 44. The address expansion unit 34 restarts the generation of an address when the refresh cycle signal, which is set to "0", is input from the sub-address expansion unit 44. The address-designating unit 36 outputs the address, which is output from the address expansion unit 34, to the multiplexer 38 and the vector cache memory 32.

The multiplexer 38 selects and outputs one of the addresses input from the address-designating unit 36 and the address input from the sub-address designating unit 48, based on the refresh cycle signal input from the sub-address expansion unit 44. In the present embodiment, the address input from the sub-address designating unit 48 is selected when the refresh cycle signal is "1", and the address input from the address-designating unit 36 is selected when the refresh cycle is "0".

The pattern generating unit 50 has a control-instruction memory 52, a pattern operator 54, a resistor XB, a resistor YB, and a resistor RF. The control instruction memory 52 stores the control instruction, which generates a test pattern, and outputs the control instruction, which corresponds to the address input from the multiplexer 38, to the pattern operator 54. The resistors XB and YB respectively store a column address value and a row address value of the DRAM 18, which is an object to be tested. The resistor RF stores the row address for refreshing the DRAM 18, which is an object to be tested.

The pattern operator 54 generates a test pattern based on the control instruction output from the control instruction memory 52. As a test pattern, there are, for example, an address signal, a RAS (Row Address Strobe) signal, a CAS (Column Address Strobe) signal, data (DATA) signal, and a write enable signal (/WE: where "/" stands for reverse logic). The data signal includes an input test pattern, which is to be input to the DRAM 18, or an expectation value pattern, which is expected to be output from the DRAM 18.

Here, in the present embodiment, a pattern memory and an interruption pattern memory mentioned in the claims are comprised of the control instruction memory 52. The interruption vector memory mentioned in the claims is comprised of the sub-vector memory 40. The interruption address expansion unit mentioned in the claims is comprised of the sub-address expansion unit 44. The pattern generator mentioned in the claims is comprised of the multiplexer 38 and the pattern generating unit 50. The interruption detecting unit and the interruption end detecting unit mentioned in the claims are comprised of the sub-address expansion unit 44. The interruption controller and the starting controller mentioned in the claims are comprised of the address expansion unit 34. The address selecting unit mentioned in the claims is comprised of the multiplexer 38, and the unified pattern generating unit mentioned in the claims is comprised of the pattern generating unit 50.

FIG. 6 shows various kind of information stored in the pattern generating unit according to the first embodiment of the present invention. FIG. 6(A) shows a sequence instruction stored in the sub-vector memory 40. In FIG. 6(A), "RTN" is an instruction that outputs the present address, returns the address to the initial address and restarts the process of outputting the test pattern according to the sequence instruction stored in the vector memory 30. The instructions, which are not described above, are similar to the instruction of the conventional example shown in FIG. 2. FIG. 6(B) shows the sequence instructions to red in the vector memory 30. In FIG. 6(B), each instruction is similar to the instructions of the conventional example shown in FIG. 2.

FIG. 6(C) shows a part of the control instruction stored in the control instruction memory 52. In FIG. 6(C), "REF-IN", which is an example of an interruption test pattern, is an instruction for outputting the signal that directs the DRAM 18 to execute the REF-IN operation, which is a pre-process of the refreshing process. In the present embodiment, "REF-IN" is an instruction for pre-charging the DRAM 18. Specifically, in the present embodiment, REF-IN is an instruction for outputting the value of the resistor XB as an address signal and outputting the RAS signal, which is set to HIGH. "REF-OUT", which is another example of an interruption test pattern, is an instruction. For outputting the signal that directs the DRAM 18 to execute the REF-OUT operation, which is a post-process of the refreshing process. In the present embodiment, "REF-OUT" is an instruction for outputting the signal to make the DRAM 18 input the row address. Specifically, in the present embodiment, REF-OUT is an instruction for outputting the value of the resistor YB as an address signal and outputting the RAS signal, which is set to LOW. The instructions other than the instructions shown above are similar to the instructions of the conventional example as shown in FIG. 2.

Figure 7:
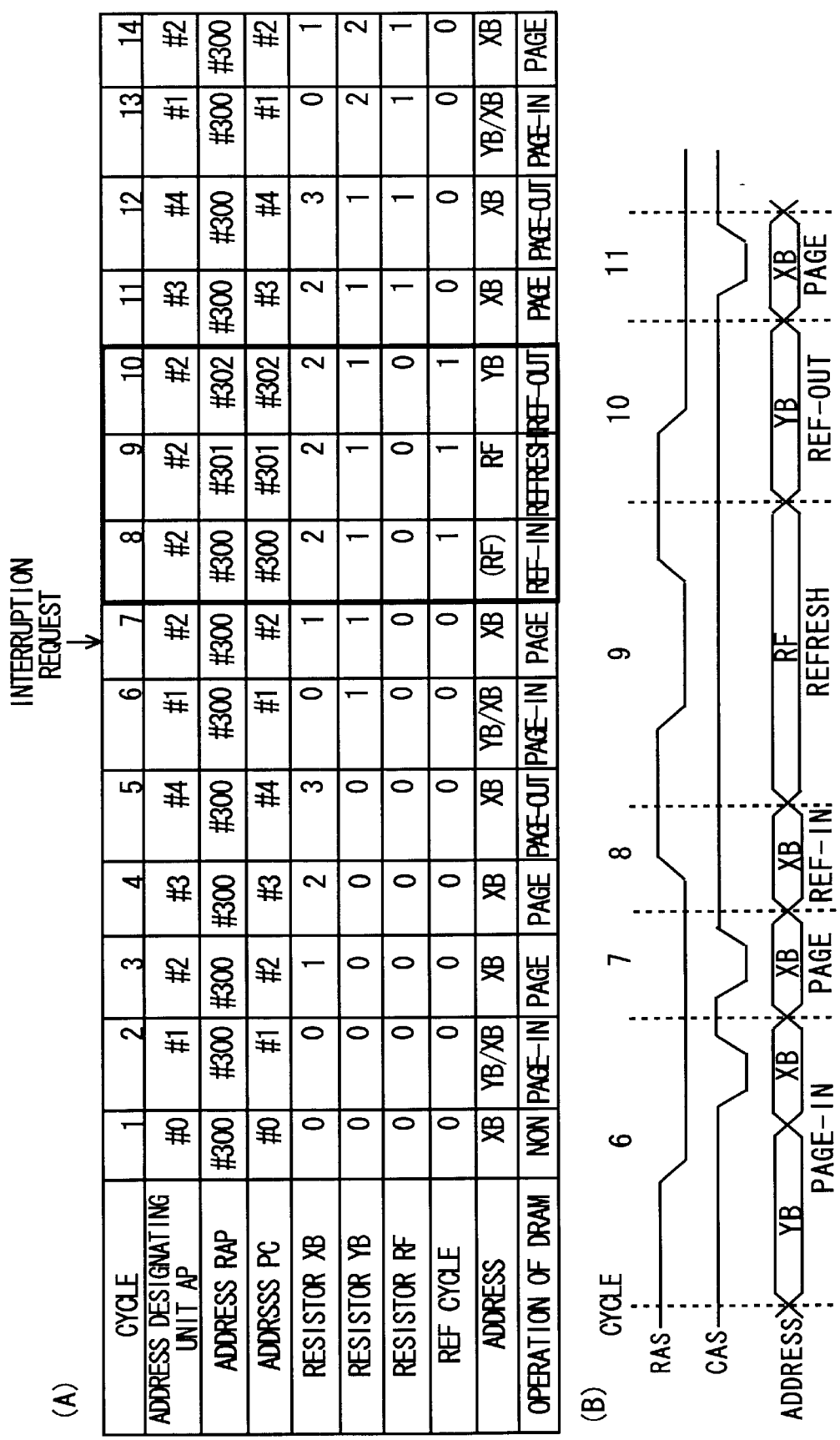
FIGS. 7(A,B) shows an example of the operation of the pattern generator according to the first embodiment of the present embodiment.

FIG. 7 shows an example of the operation of the pattern generator according to the first embodiment of the present embodiment. FIG. 7 shows an operation of the pattern generator 12 when the various kinds of information shown in FIG. 6 are stored in the pattern generator 12, and shows the operation when the timer 42 generates the interruption request at the cycle 7, in which the DRAM 18 executes the PAGE operation.

FIG. 7(A) shows the value of the address output by the address-designating unit 36, the value of the address RAP output by the sub-address designating unit 48, the value of the address PC output by the multiplexer 38, the value of the resistor XB, the value of the resistor YB, the value of the resistor RF, the value of the refresh cycle signal (REF CYCLE), the operation of the resistor, which is to be a provider of the address to be output to the DRAM 18, and the operation of the DRAM 18 for each cycle during the operation of the pattern generator 12. FIG. 7(B) shows a signal, which is to be output to the DRAM 18 by the pattern generator 12, from the cycle 6 to the cycle 11.

In the cycle 1, the address expansion unit 34 inputs "NOP" from the vector cache memory 32, makes the address-designating unit 36 output the present address value "#0" and sets the address value to "#1". Here, the refresh cycle signal "0" is output from the sub-address expansion unit 44. Because the refresh cycle signal is "0", the multiplexer 38 outputs "#0", which is output from the address-designating unit 36, as an address PC to the pattern generating unit 50. Thereby the instructions "XB<0" and "YB<0" are provided to the pattern operator 54 from the control instruction memory 52. Then, the pattern operator 54 sets the value of the resistor XB and the resistor YB to "0" in the next cycle.

In the cycle 2, the address expansion unit 34 inputs "NOP", which is the next instruction, from the vector cache memory 32, makes the address-designating unit 36 output the present address value "#1" and sets the address value to "#2". Here, the refresh cycle signal "0" is output from the sub-address expansion unit 44. Because the refresh cycle signal is "0", the multiplexer 38 outputs to the pattern generating unit 50 "#1", which is output from the address-designating unit 36, as an address PC. Thereby the instructions "XB<XB+1" and "PAGE-IN" are provided to the pattern operator 54 from the control instruction memory 52.

The pattern operator 54 thereby outputs the value of the resistor YB as an address signal and outputs the RAS signal, which is set to LOW. The pattern operator 54 also outputs the value of the resistor XB as an address signal and outputs the CAS signal, which is set to be a negative pulse. The DRAM 18 thereby executes the PAGE-IN operation. Furthermore, the pattern operator 54 adds "1" to the value of the resistor XB in order to be "1" in the next cycle. Similar operations as shown above are executed from the cycle 3 to the cycle 7.

In cycle 6, as shown in FIG. 7(B), the pattern operator 54 outputs the value of the resistor YB as an address signal and outputs the RAS signal, which is set to LOW. The pattern operator 54 then outputs the value of the resistor XB as an address signal and outputs the CAS signal, which is set to be a negative pulse. The DRAM 18 thereby executes the PAGE-IN operation, that is, the reading process or the writing process on the memory cell corresponding to the column of the value of the resistor XB and the row of the value of the resistor YB.

In the cycle 7, as shown in FIG. 7(B), the pattern operator 54 outputs the value of the resistor XB as an address signal and outputs the CAS signal, which is set to be a negative pulse. The DRAM 18 thereby executes the PAGE operation, that is, the reading process and writing process on the memory cell corresponding to the column of the value of the resistor XB and the row of 38 the value of the resistor YB, which is input at the cycle 6.

Here, if the timer 42 detects that a predetermined time has passed at the cycle 7, the timer 42 outputs the interruption request to the sub-address expansion unit 44. This occurs because the timer 42 indicates when the time for executing the refreshing operation has arrived. The sub-address expansion unit 44 sets the refresh cycle signal to "1" at the next cycle 8 and outputs the refresh cycle signal to the address expansion unit 34 and the multiplexer 38.

In the cycle 8, because the refresh cycle signal is "1", the address expansion unit 34 makes the address-designating unit 36 hold the present address value and stops the generation of an address generated by the vector instruction. On the other hand, the sub-address expansion unit 44 inputs the instruction "NOP" from the sub-vector memory 40, makes the sub-address designating unit 48 output the present address value "#0" and sets the address value to "#1". The sub-address designating unit 48 adds the address value "#0" received from the sub-address expansion unit 44 and the address value "#300" stored in the starting address storing unit 46, and outputs the sum to the multiplexer 38.

Because the refresh cycle signal is "1", the multiplexer 38 outputs the address "#300", which is out put from the sub-address designating unit 48, as an address PC to the pattern generating unit 50. The control instruction memory 52 there by inputs "REF-IN", which corresponds to the address "#300", to the pattern operator 54. As shown in FIG. 7(B), the pattern operator 54 then outputs the value of the resistor XB as an address signal and outputs the RAS signal, which is set to HIGH. The DRAM is thereby pre-charged.

In cycle 9, because the refresh cycle signal is "1", the address expansion unit 34 stops the generation of an address generated by the vector instruction. On the other hand, the sub-address expansion unit 44 inputs the next instruction "NOP" from the sub-vector memory 40, makes the sub-address designating unit 48 output the present address value "#1", and sets the address value to "#2". The sub-address designating unit 48 outputs the address value "#301", which is the sum of the address value "#1" received from the sub-address expansion unit 44 and the address value "#300" stored in the starting address storing unit 46, to the multiplexer 38.

Because the refresh cycle signal is "1", the multiplexer 38 outputs the address "#301", which is output from the sub-address designating unit 48, as an address PC to the pattern generating unit 50. The control instruction memory 52 thereby outputs to the pattern operator 54 "REFRESH", which corresponds to the address "#301",. The pattern operator 54 thereby outputs the value of the resistor RF as an address signal and outputs the RAS signal, which is set to LOW. The DRAM 18 thereby executes the REFRESH operation, that is, the refreshing operation on the row of the value of the resistor RF.

In cycle 10, because the refresh cycle signal is "1", the address expansion unit 34 stops the generation of an address generated by the vector instruction. On the other hand, the sub-address expansion unit 44 inputs the next instruction "RTN" from the sub-vector memory 40, makes the sub-address designating unit 48 output the present address value "#2" and sets the address value to "#0". The sub-address expansion unit 44 sets the refresh cycle signal to "0" and outputs the refresh cycle signal. The sub-address designating unit 48 outputs the address value "#302", which is the sum of the address value "#2" received from the sub-address expansion unit 44 and the address value "#300" stored in the starting address storing unit 46, to the multiplexer 38. Because the refresh cycle signal is "1", the multiplexer 38 outputs the address "#302", which is output from the sub-address designating unit 48, as an address PC to the pattern generating unit 50.

The control instruction memory 52 thereby inputs "RF<RF+1" and "REF-OUT" stored in the address "#302" into the pattern operator 54. The pattern operator 54 thereby outputs the value of the resistor YB as an address signal, sets the RAS signal to LOW and out puts the RAS signal. The DRAM 18 therefore executes the REF-OUT operation, that is, the operation to input the row address held before executing the REFRESH operation. Moreover, the pattern operator 54 adds "#1" to the value of the resistor RF in the next cycle.

In cycle 11, the sub-address expansion unit 44 sets the refresh cycle signal to "0" and outputs the refresh cycle signal to the address expansion unit 34 and the multiplexer 38. The address expansion unit 34 thereby restarts the generation of the address by the vector instruction. Moreover, the multiplexer 38 outputs the address "#3", which is output from the address-designating unit 36, as an address PC to the pattern generating unit 50. Then, the control instruction memory 52 outputs "XB<XB+1" and "PAGE", which correspond to the address "#3", to the pattern operator 54. As shown in FIG. 7(B), the pattern operator 54 outputs the value of the resistor XB as an address signal and outputs the CAS signal, which is set to be a negative pulse.

Here, because the row address, which was held before executing the refreshing operation was already input to the DRAM 18 in the cycle 10, the DRAM 18 executes the PAGE operation, that is, the reading process and the writing process on the memory cell corresponding to the column of the value of the resistor XB and the row of the value of the resistor YB that was already input at the cycle 10. The following cycle is executed as shown above. In this way, the interruption request can be generated by the timer 42 during the PAGE operation, the DRAM 18 can be refreshed, and the DRAM 18 can execute the PAGE operation without trouble, after the refreshing operation.

Figure 8:
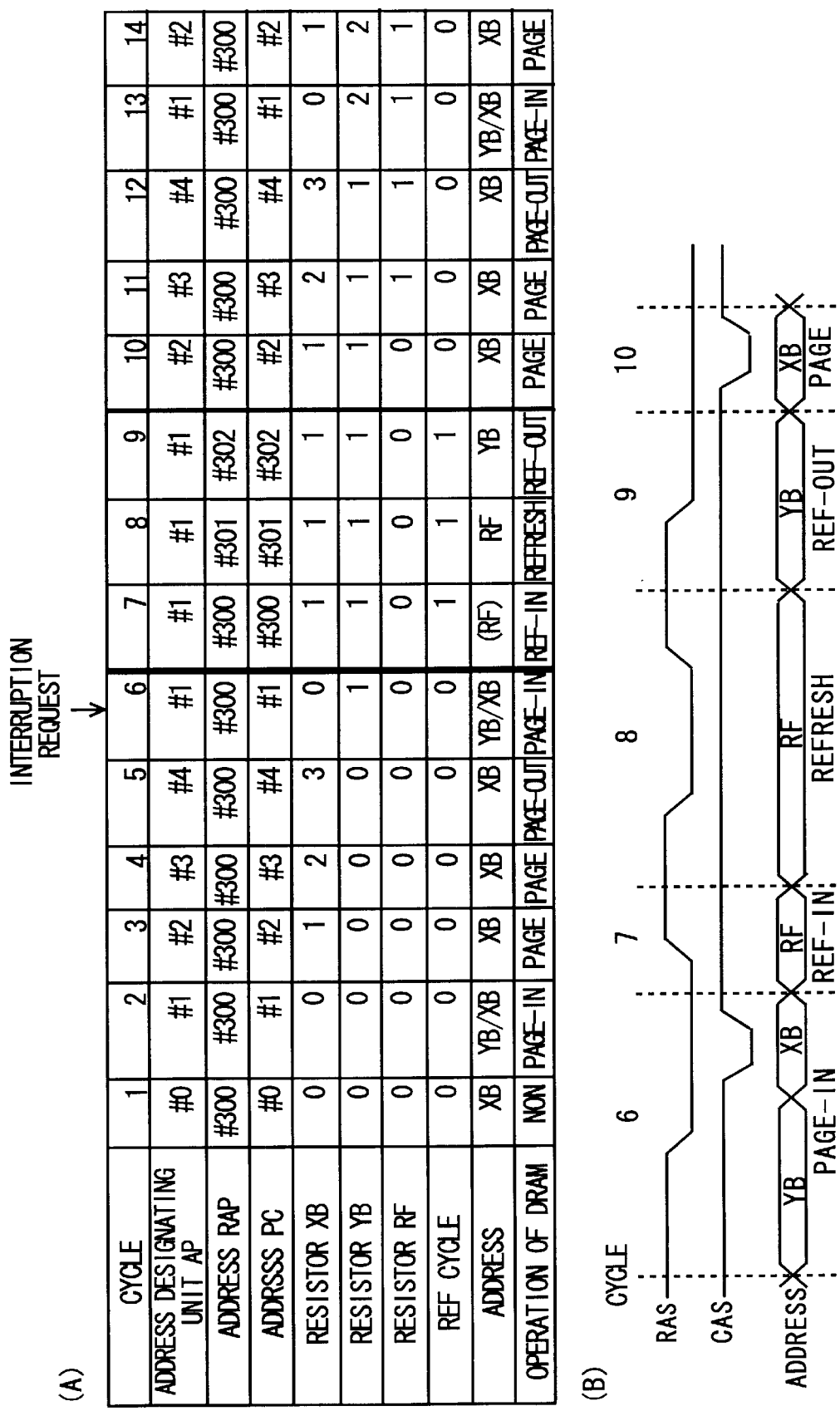
FIGS. 8(A,B) shows another example of the operation of the pattern generator according to the first embodiment of the present FIGS. 9(A,B) shows further another example of the operation of the pattern generator according to the first embodiment of the present invention.

FIG. 8 shows another example of the operation of the pattern generator according to the first embodiment of the present invention. FIG. 8 shows an operation of the pattern generator 12 when the various kinds of information shown in FIG. 6 are stored in the pattern generator 12. FIG. 8 especially shows an operation of the pattern generator 12 when the timer 42 generates an interruption request at the cycle 6 in which the DRAM 18 executes the PAGE-IN operation.

FIG. 8(A) shows the value of the address output by the address-designating unit 36, the value of the address RAP output by the sub-address designating unit 48, the value of the address PC output by the multiplexer 38, the value of the resistor XB, the value of the resistor YB, the value of the resistor RF, the value of the refresh cycle signal, the operation of the resistor, which is to be the provider of the address to be output to the DRAM 18, and the operation of the DRAM for each cycle during the operation of the pattern generator 12. FIG. 8(B) shows a signal, which is to be output to the DRAM 18 by the pattern generator 12, from the cycle 6 to the cycle 10.

From cycle 1 to cycle 6, the pattern generator 12 executes the same operation as the cycle shown in FIG. 7. Here, if the timer 42 detects that a predetermined time has passed at the cycle 6, the timer 42 outputs the interruption request to the sub-address expansion unit 44. This occurs because the timer 42 indicates when the time for executing the refreshing operation has come. The sub-address expansion unit 44 sets the refresh cycle signal to "1" at the next cycle 7 and outputs the refresh cycle signal to the address expansion unit 34 and the multiplexer 38. The pattern generator 12 executes the same operation as shown in FIG. 7 from cycle 7 to cycle 9, and outputs the signal as shown in FIG. 8(B) to the DRAM 18.

In cycle 10, the sub-address expansion unit 44 sets the refresh cycle signal to and outputs this to the address expansion unit 34 and the multiplexer 38. The address expansion unit 34 thereby restarts the generation of the address by the vector instruction. Moreover, the multiplexer 38 outputs the address "#2", which is output from the address-designating unit 36, as an address PC to the pattern generating unit 50.

Then, the control instruction memory 52 outputs to the pattern operator 54 "XB<XB+1" and "PAGE", which correspond to the address "#2". As shown in FIG. 8(B), the pattern operator 54 outputs the value of the resistor XB as an address signal and outputs the CAS signal, which is set to be a negative pulse. Here, because the row address, which was held before executing the REFRESH operation, was already input to the DRAM 18 in the cycle 9, the DRAM 18 executes the PAGE operation, that is, the reading process and the writing process on the memory cell corresponding to the column of the value of the resistor XB and the row of the value of the resistor YB that had been already input at the cycle 6. The following cycles are executed as shown above. In this way, the interruption request is generated by the timer 42 during the PAGE-IN operation, the DRAM 18 can be refreshed, and the DRAM 18 can execute the PAGE operation without trouble, after the refreshing operation.

Figure 9:
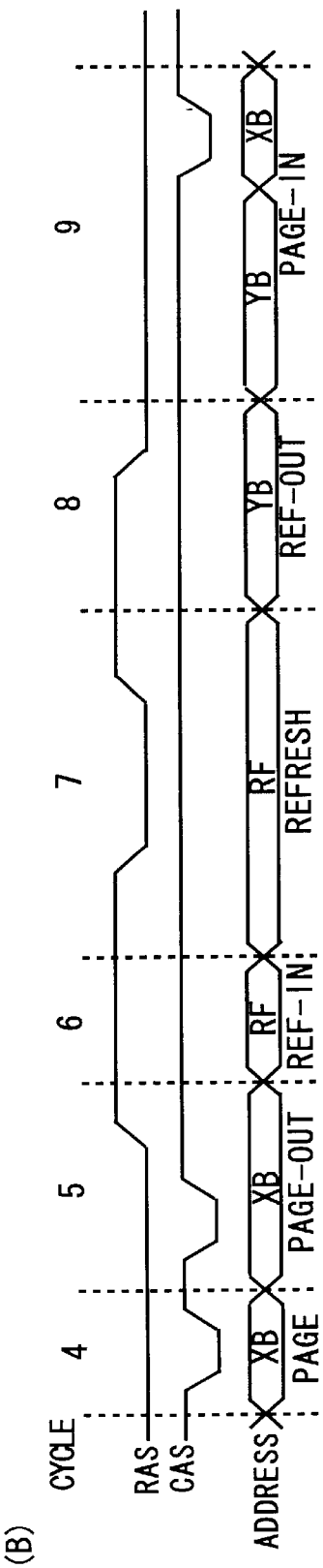

FIG. 9 shows further another example of the operation of the pattern generator according to the first embodiment of the present invention. FIG. 9 shows an operation of the pattern generator 12 when the various kinds of information shown in FIG. 6 are stored in the pattern generator 12. FIG. 9 especially shows an operation of the pattern generator 12 when the timer 42 generates an interruption request at the cycle 5 in which the DRAM 18 executes the PAGE-OUT operation.

FIG. 9(A) shows the value of the address output by the address-designating unit 36, the value of the address RAP output by the sub-address designating unit 48, the value of the address PC output by the multiplexer 38, the value of the resistor XB, the value of the resistor YB, the value of the resistor RF, the value of the refresh cycle signal, the operation of the resistor, which is to be a provider of the address to be output to the DRAM 18, and the operation of the DRAM for each cycle during the operation of the pattern generator 12. FIG. 9(B) shows a signal, which is to be output to the DRAM 18 by the pattern generator 12, from the cycle 4 to the cycle 9.

From cycle 1 to cycle 5, the pattern generator 12 executes the same operation as the cycle shown in FIG. 7. Here, if the timer 42 detects that a predetermined time has passed at the cycle 5, the timer 42 outputs the interruption request to the sub-address expansion unit 44. This is because the timer 42 indicates when the time for executing the refreshing operation has come. The sub-address expansion unit 44 sets the refresh cycle signal to "1" at the next cycle 6 and outputs the refresh cycle signal to the address expansion unit 34 and the multiplexer 38. The pattern generator 12 executes the same operation as shown in FIG. 7 from cycle 6 to cycle 8 and outputs the signal as shown in FIG. 9(B) to the DRAM 18.

In cycle 9, the sub-address expansion unit 44 sets the refresh cycle signal to "0" and outputs the refresh cycle signal to the address expansion unit 34 and the multiplexer 38. The address expansion unit 34 thereby restarts the generation of the address by the vector instruction. Moreover, the multiplexer 38 outputs the address "#1", which is output from the address-designating unit 36, as an address PC to the pattern generating unit 50.

Then, the control instruction memory 52 outputs to the pattern operator 54 "XB<XB+1" and "PAGE-IN", which correspond to the address "#1". As shown in FIG. 9(B), the pattern operator 54 outputs the value of the resistor YB as an address signal and outputs the RAS signal, which is set to LOW. The pattern operator 54 then outputs the value of the resistor XB as an address signal and outputs the CAS signal, which is set to be a negative pulse. The DRAM 18 there by executes the PAGE-IN operation. The following cycles are executed as shown above. In this way, even the interruption request can be generated by the timer 42 during the PAGE-OUT operation, the DRAM 18 can be refreshed, and the DRAM 18 can execute the PAGE-IN operation without trouble, after the REFRESH operation.

As shown above, even the interruption request can be generated at any point in time of the PAGE operation, PAGE-IN operation, or PAGE-OUT operation, the DRAM 18 can be refreshed, and the DRAM 18 can execute a desired operation without trouble, after the REFRESH operation.

Figure 10:
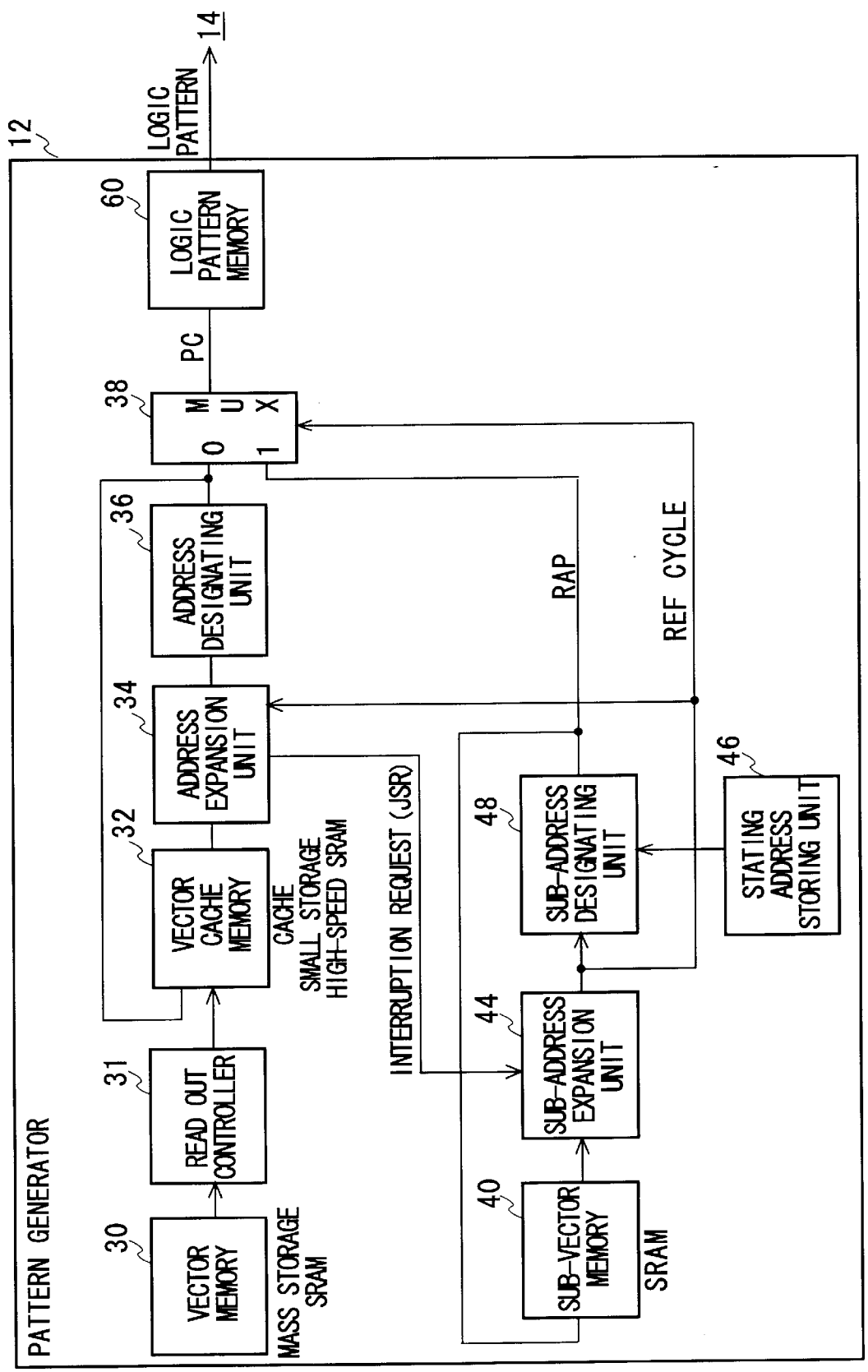
FIG. 10 shows a configuration of the pattern generator according to the second embodiment of the present invention.

FIG. 10 shows a configuration of the pattern generator according to the second embodiment of the present invention. The pattern generator 12 shown in FIG. 10 generates a test pattern for testing a device having a logic unit as an example of the electric part 18. In FIG. 10, the configuration having a same function element as the first embodiment is provided with the same reference numerals.

The difference between the pattern generator 12 of the present embodiment and the pattern generator 12 of the first embodiment will be explained below. The pattern generator 12 of the present embodiment does not contain the timer 42 and comprises a logic pattern memory 60, which stores a logic pattern as an example of a test pattern, instead of the pattern generating unit 50. The address expansion unit 34 of the present embodiment outputs the interruption request to the sub-address expansion unit 44 when detecting the jump instruction (JSR) in the vector instruction, which instructs a jump to the subroutine.

The sub-address expansion unit 44 sets the refresh cycle signal to "1" until the end of the generation process of the test pattern which is used for the subroutine of the interruption process, when receiving the interruption request from the address expansion unit 34. Then, the sub-address expansion unit 44 outputs the refresh cycle signal, which is set to "1", to the address expansion unit 34 and the multiplexer 38. In other cases, that is, when the sub-address expansion unit 44 does not receive the interruption request from the address expansion unit 34, the sub-address expansion unit 44 sets the refresh cycle signal to "0" and outputs to the address expansion unit 34 and the multiplexer 38.

Here, in the present embodiment, the pattern memory and the interruption pattern memory mentioned in the claims are comprised of the logic pattern memory 60. The interruption vector memory mentioned in the claims is consticomprised of the sub-vector memory 40. The interruption address expansion unit mentioned in the claims is comprised of the sub-address expansion unit 44. The pattern generating unit mentioned in the claims is comprised of the multiplexer 38 and the logic pattern memory 60. The interruption detecting unit and the interruption end detecting unit mentioned in the claims are comprised of the sub-address expansion unit 44. The interruption controller and the starting controller mentioned in the claims are comprised of the address expansion unit 34. The address selecting unit mentioned in the claims is comprised of the multiplexer 38, and the unified pattern generating unit mentioned in the claims is comprised of the logic pattern memory 60.

FIG. 11 shows various kinds of information stored in the pattern generator according to the second embodiment of the present invention. FIG. 11(A) shows a sequence instruction stored in the vector memory 30. In FIG. 11(A), "JSR" is an instruction that outputs the present address, jumps to the subroutine and adds "#1" to the present address. The instructions, which are not described above, are similar to the instruction of the conventional example shown in FIG. 2. FIG. 11(B) shows the sequence instruction stored in the sub-vector memory 40. In FIG. 11(B), each instruction is similar to the instructions of the first embodiment shown in FIG. 6.

FIG. 11(C) shows an example of a test pattern stored in the logic pattern memory 60. In FIG. 11(C), PAT-1, PAT-2, and so on, are test patterns for a main routine, and SPAT-1, SPAT-2, and SPAT-3 are test patterns for a subroutine as an example of an interruption test pattern. Each test pattern includes an input test pattern for testing an electric part and an expectation value pattern, which is expected to be output after inputting the input test pattern into a normal electric part.

FIG. 12 shows an example of the operation of the pattern generator according to the second embodiment of the present embodiment. FIG. 12 shows an operation of the pattern generator 12 when the various kinds of information shown in FIG. 11 are stored in the pattern generator 12. Moreover, FIG. 12 shows the value of the address output by the address-designating unit 36, the value of the address RAP output by the sub-address designating unit 48, the value of the address PC output by the multiplexer 38, the value of the refresh cycle signal, and the logic pattern to be output.

In cycle 1, the address expansion unit 34 inputs "NOP" from the vector cache memory 32, makes the address-designating unit 36 output the present address value "#0" and sets the address value to "#1". Here, the refresh cycle signal of "0" is output from the sub-address expansion unit 44. Because the refresh cycle signal is "0", the multiplexer 38 outputs "#0", which is output from the address-designating unit 36, as an address PC to the logic pattern memory 60. Thereby, the logic pattern memory 60 outputs PAT-1, which corresponds to the address "#0".

In cycle 2, the address expansion unit 34 inputs "JSR" from the vector cache memory 32, makes the address-designating unit 36 output the present address value "#1", sets the address value to "#2" and outputs the interruption request to the sub-address expansion unit 44. The sub-address expansion unit 44 thereby sets the refresh cycle signal to "1" and outputs the refresh cycle signal to the address expansion unit 34 and the multiplexer 38 from the next cycle 3 to the cycle in which the RTN instruction is executed. Moreover, because the refresh cycle signal is "0", the multiplexer 38 outputs "#1", which is output from the address-designating unit 36, as an address PC to the logic pattern memory 60. Thereby the logic pattern memory 60 outputs PAT-2, which corresponds to the address "#1".

In cycle 3, because the refresh cycle signal is "1", the address expansion unit 34 makes the address-designating unit 36 hold the present address value and stops the generation of an address by the vector instruction. On the other hand, the sub-address expansion unit 44 inputs the instruction "NOP" from the sub-vector memory 40, makes the sub-address designating unit 48 output the present address value "#0" and sets the address value to "#1". The sub-address designating unit 48 adds the address value "#0" received from the sub-address expansion unit 44 and the address value "#300" stored in the starting address storing unit 46 and outputs the sum to the multiplexer 38. Because the refresh cycle signal is "1", the multiplexer 38 outputs the address "#300", which is output from the sub-address designating unit 48, as an address PC to the logic pattern memory 60. The logic pattern memory 60 thereby outputs the logic pattern SPAT-1, which is a subroutine.

In cycle 4, because the refresh cycle signal is "1", the address expansion unit 34 makes the address-designating unit 36 hold the present address value and stops the generation of an address by the vector instruction. On the other hand, the sub-address expansion unit 44 inputs the instruction "NOP" from the sub-vector memory 40, makes the sub-address designating unit 48 output the present address value "#1" and sets the address value to "#2". The sub-address designating unit 48 adds the address value "#1" received from the sub-address expansion unit 44 and the address value "#300" stored in the starting address storing unit 46 and outputs the added value "#301" to the multiplexer 38. Because the refresh cycle signal is "1", the multiplexer 38 outputs the address "#301", which is output from the sub-address designating unit 48, as an address PC to the logic pattern memory 60. The logic pattern memory 60 thereby outputs the logic pattern SPAT-2, which is a subroutine.

In cycle 5, because the refresh cycle signal is "1", the address expansion unit 34 makes the address-designating unit 36 hold the present address value and stops the generation of an address by the vector instruction. On the other hand, the sub-address expansion unit 44 inputs the instruction "RTN" from the sub-vector memory 40, makes the sub-address designating unit 48 output the present address value "#2" and sets the address value to "#0". Because the instruction input from the sub-vector memory 40 is "RTN", the sub-address expansion unit 44 sets the refresh cycle signal to "0" and outputs the refresh cycle in the next cycle.

The sub-address designating unit 48 adds the address value "#2" received from the sub-address expansion unit 44 and the address value "#300" stored in the starting address storing unit 46, and outputs the added value "#302" to the multiplexer 38. Because the refresh cycle signal is "1", the multiplexer 38 outputs the address "#302", which is output from the sub-address designating unit 48, as an address PC to the logic pattern memory 60. The logic pattern memory 60 thereby outputs the logic pattern SPAT-3, which is a subroutine.

In cycle 6, the sub-address expansion unit 44 sets the refresh cycle signal to "0" and outputs the refresh cycle signal to the address expansion unit 34 and the multiplexer 38. The address expansion unit 34 thereby restarts the generation of the address of the vector instruction. Moreover, the multiplexer 38 outputs the address "#2", which is output from the address-designating unit 36, to the logic pattern memory 60 as an address PC. The logic pattern memory 60 thereby outputs the pattern PAT-3, which is a subroutine. The following cycle is executed as shown above. In this way, the pattern generator according to the present invention can generate a test pattern based on the vector instruction, which becomes a subroutine, using a simple configuration.

Figure 13:
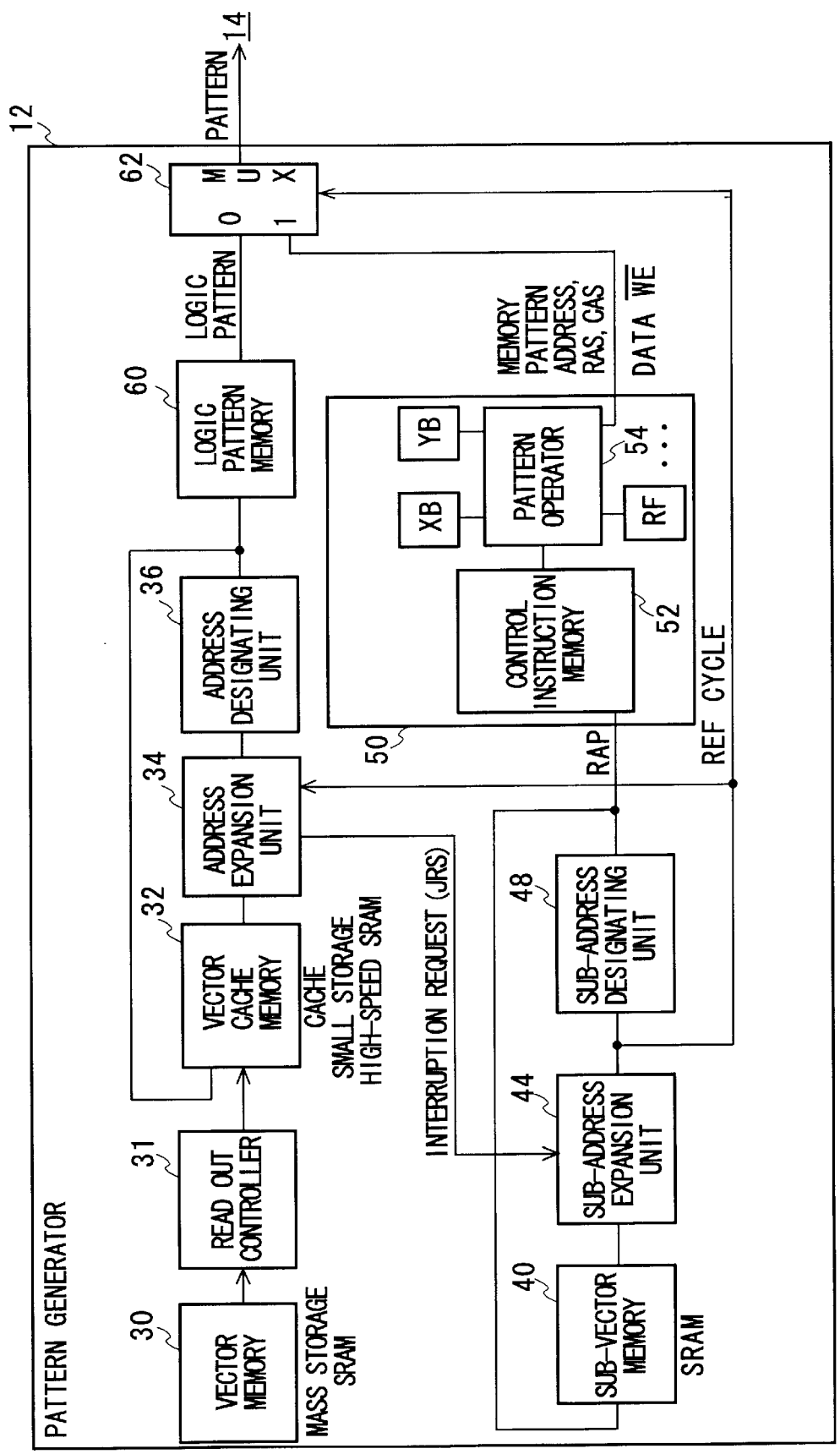
FIG. 13 shows a configuration of the pattern generator according to the third embodiment of the present invention.

FIG. 13 shows a configuration of the pattern generator according to the third embodiment of the present invention. The pattern generator 12 shown in FIG. 13 generates a test pattern or testing a device with a memory unit and a logic unit mounted together, as an example of the electric part 18. The same reference numerals as the reference numerals of the first embodiment and the second embodiment are provided to the configurations of the pattern generator of the present embodiment having the same functional elements as the functional elements of the first embodiment and the second embodiment.

The difference between the pattern generator 12 of the present embodiment and the second embodiment will be explained below. The pattern generator 12 of the present embodiment does not comprise the multiplexer 38 and the starting address storing unit 46. However, the pattern generator 12 of the present embodiment comprises the pattern generating unit 50 and the multiplexer 62. The pattern generating unit 50 generates a test pattern for a memory unit, or memory pattern, based on the address output from the sub-address designating unit 48.

The multiplexer 62 selects and outputs a test pattern for the logic unit, or logic pattern, output from the logic pattern memory 60 and a memory pattern output from the pattern generating unit 50, based on the refresh cycle signal input from the sub-address expansion unit 44. In the present embodiment, the memory pattern output from the pattern generating unit 50 is selected when the refresh cycle signal is "1", and the logic pattern output from the logic pattern memory 60 is selected when the refresh cycle signal is "0".

Here, in the present embodiment, a pattern memory mentioned in the claims is comprised of the logic pattern memory 60. The interruption pattern memory mentioned in the claims is comprised of the control instruction memory 52. The interruption vector memory mentioned in the claims is comprised of the sub-vector memory 40. The interruption address expansion unit mentioned in the claims is comprised of the sub-address expansion unit 44. The first pattern generating unit mentioned in the claims is comprised of the logic pattern memory 60. The second pattern generating unit mentioned in the claims is comprised of the pattern generating unit 50. The interruption detecting unit and the interruption end detecting unit mentioned in the claims are comprised of the sub-address expansion unit 44. The interruption controller and the starting controller mentioned in the claims are comprised of the address expansion unit 34. The test pattern selecting unit mentioned in the claims is comprised of the multiplexer 62.

FIG. 14 shows various kinds of information stored in the pattern generator according to the third embodiment of the present invention. FIG. 14(A) shows a sequence instruction stored in the vector memory 30. In FIG. 14(A), each instruction is the same as the instructions explained above. FIG. 14(B) shows the sequence instruction stored in the sub-vector memory 40. In FIG. 14(B), each instruction is the same as the instructions explained above. FIG. 14(C) shows an example of the test pattern stored in the logic pattern memory 60. In FIG. 14(C), PAT-1, PAT-2, and so on, are test patterns. FIG. 14(D) shows an example of the control instruction stored in the control instruction memory 52. In FIG. 14(D), each of the instructions are the same as the instructions explained above.

FIG. 15 shows an example of the operation of the pattern generator according to the third embodiment of the present embodiment. FIG. 15 shows an operation of the pattern generator 12 when the various kinds of information shown in FIG. 14 are stored in the pattern generator 12. Moreover, FIG. 15 shows the value of the address output by the address-designating unit 36, the value of the address RAP output by the sub-address designating unit 48, the value of the refresh cycle signal, and the pattern to be output.

In cycle 1, the address expansion unit 34 inputs "NOP" from the vector cache memory 32, makes the address-designating unit 36 output the present address value "#0" and sets the address value to "#1". The logic pattern memory 60 outputs PAT-1, which corresponds to the address "#0". Here, the refresh cycle signal of "0" is output from the sub-address expansion unit 44. Because the refresh cycle signal is "0", the multiplexer 62 outputs PAT-1, which is output from the logic pattern memory 60.

In cycle 2, the address expansion unit 34 inputs the next instruction "JSR" from the vector cache memory 32, makes the address-designating unit 36 output the present address value "#1", sets the address value to "#2" and outputs the interruption request to the sub-address expansion unit 44. The sub-address expansion unit 44 thereby sets the refresh cycle signal to "1" and outputs to the address expansion unit 34 and the multiplexer 62 from the next cycle 3 to the cycle in which the RTN instruction is executed. Moreover, the logic pattern memory 60 outputs PAT-2, which corresponds to the address "#1". Because the refresh cycle signal is "0", the multiplexer 62 outputs PAT-2, which is output from the logic pattern memory 60.

In cycle 3, because the refresh cycle signal is "1", the address expansion unit 34 makes the address-designating unit 36 hold the present address value and stops the generation of the address by the vector instruction. On the other hand, the sub-address expansion unit 44 inputs the instruction "NOP" from the sub-vector memory 40, makes the sub-address designating unit 48 output the present address value "#0" and sets the address value to "#1". The sub-address designating unit 48 outputs the address value "#0" received from the sub-address expansion unit 44 to the pattern generating unit 50. Thereby, the instructions "XB<0" and "YB<0"are provided to the pattern operator 54 from the control instruction memory 52. Therefore, the pattern operator 54 sets the value of the resistor XB and the value of the resistor YB to "0" in the next cycle. The pattern operator 54 generates the memory pattern according to the control instruction. Because the refresh cycle signal is "1", the multiplexer 62 out puts the memory pattern, which is output from the pattern generating unit 50.

In cycle 4, the sub-address expansion unit 44 inputs the instruction "NOP" from the sub-vector memory 40, makes the sub-address designating unit 48 output the present address value "#1", and sets the address value to "#2". The sub-address designating unit 48 outputs the address value "#1" received from the sub-address expansion unit 44. The instruction "XB<XB+1" is thereby provided to the pattern operator 54 from the control instruction memory 52. The pattern operator 54 thus adds "1" onto the value of the resist or XB in the next cycle. The pattern operator 54 generates the memory pattern according to the control instruction. Because the refresh cycle signal is "1", the multiplexer 62 outputs the memory pattern out put from the pattern generating unit 50. The pattern generator 12 operates similarly as explained above for the cycle 5 to cycle 11.

In cycle 12, the sub-address expansion unit 44 inputs the instruction "RTN" from the sub-vector memory 40 and makes the sub-address designating unit 48 output the present address value "#5". The sub-address designating unit 48 outputs the address value "#5" received from the sub-address expansion unit 44 to the pattern generating unit 50. Because the instruction input from the sub-vector memory 40 is "RTN", the sub-address expansion unit 44 sets the refresh cycle signal to "0" and outputs the refresh cycle signal in the next cycle 13.

In cycle 13, the sub-address expansion unit 44 sets the refresh cycle signal to "0" and outputs the refresh cycle signal to the address expansion unit 34 and the multiplexer 62. The address expansion unit 34 thereby restarts the generation of the address of the vector instruction, inputs the next instruction "NOP" from the vector cache memory 32, makes the address-designating unit 36 output the present address value "#2" and sets the address value to "#3". The logic pattern memory 60 then outputs the PAT-3, which corresponds to the address "#2". Because the refresh cycle signal is "0", the multiplexer 62 outputs PAT-3, which is output from the logic pattern memory 60. The following cycle is executed as explained above. In this way, the pattern generator of the present embodiment can generate the logic pattern and the memory pattern using a simple configuration. Furthermore, the pattern generator of the present embodiment can generate a logic pattern and a memory pattern which are synchronized with each other.

This invention is not limited to the embodiments described above, but the various modifications can be made. For example, in the second embodiment described above, the logic pattern memory 60 outputs the test pattern. However, the present invention is not limited to this configuration, and the pattern generating unit 50 shown in the first embodiment may output the test pattern.

Moreover, in the third embodiment described above, the first pattern generating unit mentioned in the claims corresponded to the logic pattern memory 60, and the second pattern generating unit mentioned in the claims corresponded to the pattern generating unit 50. However, the present invention is not limited to this configuration, and the first pattern generating unit may correspond to the pattern generating unit 50, and the second pattern generating unit may corresponded to the logic pattern memory 60. Furthermore, each of the first pattern generating unit and the second pattern generating unit may corresponded to the logic pattern memory 60, or each of the first pattern generating unit and the second pattern generating unit may corresponded to the pattern generating unit 50.

Although the present invention has been described by way of exemplary embodiments, it should be understood that many changes and substitutions may be made by those skilled in the art without departing from the spirit and the scope of the present invention which is defined only by the appended claims.

What is claimed is:

1. A pattern generator that generates a test pattern used for testing an electric part comprising:
    a pattern memory that stores test pattern information, which defines said test pattern;
    a vector memory that stores a vector instruction, which indicates an order for reading out said test pattern information from said pattern memory;
    an address expansion unit that generates an address of said test pattern information in said pattern memory according to said vector instruction stored in said vector memory;
    an interruption pattern memory that stores interruption test pattern information, which defines said test pattern during a predetermined interruption process;
    an interruption vector memory, which is different from said vector memory, that stores an interruption vector instruction which indicates an order for reading out said interruption test pattern information from said interruption pattern memory;
    an interruption address expansion unit that generates an address of said interruption test pattern information according to said interruption vector instruction stored in said interruption vector memory; and
    a pattern generating unit that generates said test pattern based on said test pattern information corresponding to said address generated by said address expansion unit or said interruption test pattern information corresponding to said address generated by said interruption address expansion unit.

2. A pattern generator as claimed in claim 1, further comprising:
    an interruption detecting unit that detects a point in time for starting said interruption process; and
    said interruption address expansion unit generates said address of said interruption test pattern information based on detection of said point in time for starting said interruption process by said interruption detecting unit; and
    said pattern generating unit generates said test pattern based on said test pattern information corresponding to said address generated by said address expansion unit when said interruption detecting unit does not detect said point in time for starting said interruption process, and said pattern generating unit generates said test pattern based on said interruption test pattern information corresponding to said address generated by said interruption address expansion unit when said interruption detecting unit detects said point in time for starting said interruption process.

3. A pattern generator as claimed in claim 2, further comprising:
   an interruption controller that interrupts generation of said address generated by said address expansion unit based on detection of said point in time for starting said interruption process by said interruption detecting unit;
   an interruption end detecting unit that detects an end of said interruption process; and
   a starting controller that starts generation of said address by said address expansion unit based on detection of said end of said interruption process by said interruption end detecting unit.

4. A pattern generator as claimed in claim 2, wherein said electric part is a memory having a function of storing data and which requires refreshing in order to hold said data, and
   said interruption pattern memory stores said interruption test pattern information, which defines a test pattern for refreshing said memory.

5. A pattern generator as claimed in claim 4, wherein said interruption pattern memory further stores said interruption test pattern information that defines a test pattern for pre-charging said memory and a test pattern for providing a column address, which is provided to said memory before executing said interruption process, to said memory;
   said pattern generating unit generates said test pattern in an order of: said test pattern for pre-charging said memory, said test pattern for refreshing said memory, and said test pattern for providing said column address when said interruption detecting unit detects said point in time for starting said interruption process.

6. A pattern generator as claimed in claim 2, further comprising is a timer for measuring time, and said interruption detecting unit detects said point in time for starting said interruption process based on said time measured by said timer.

7. A pattern generator as claimed in claim 2, wherein said vector instruction, which is stored in said vector memory, includes a description that indicates said point in time for starting said interruption process; and
   said interruption detecting unit detects said point in time for starting said interruption process based on said description.

8. A pattern generator as claimed in claim 2, wherein said test pattern information and said interruption test pattern information are stored on a single memory space corresponding to said addresses which are different from each other; and
   said pattern generating unit includes:
      an address selecting unit that selects said address generated by said address expansion unit when said interruption detecting unit does not detect said point in time for starting said interruption process and selects said address generated by said interruption address expansion unit when said interruption detecting unit detects said point in time for starting said interruption process; and
      a unified pattern generating unit that generates said test pattern based on said test pattern information or said interruption test pattern information corresponding to said address selected by said address selecting unit.

9. A pattern generator as claimed in claim 2, wherein said pattern generating unit includes:
   a first pattern generating unit that generates said test pattern based on said test pattern information corresponding to said address generated by said address expansion unit;
   a second pattern generating unit that generates said test pattern based on said interruption test pattern corresponding to said address generated by said interruption address expansion unit; and
   a test pattern selecting unit that selects said test pattern generated by said first pattern generating unit when said interruption detecting unit does not detect said point in time for starting said interruption process, and selects said test pattern generated by said second pattern generating unit when said interruption detecting unit detects said point in time for starting said interruption process.

10. A pattern generator as claimed in claim 1, wherein each of said test pattern information and said interruption test pattern is said test pattern, or a control instruction for generating said test pattern.

11. A pattern generator as claimed in claim 1, wherein one of said test pattern information and said interruption test pattern information is said test pattern; and another thereof is a control instruction for generating said test pattern.

12. An electric part testing apparatus for testing an electric part comprising:
   a pattern memory stores test pattern information that defines a test pattern including an input test pattern provided to said electric part for said testing, and an expected value, which is expected to be output from said electric part after providing said input test pattern to said electric part;
   a vector memory that stores a vector instruction, which indicates an order for reading out said test pattern information from said pattern memory;
   an address expansion unit that generates an address of said test pattern information in said pattern memory according to said vector instruction stored in said vector memory;
   an interruption pattern memory that stores interruption test pattern information, which defines said test pattern during a predetermined interruption process;
   an interruption vector memory that stores an interruption vector instruction, which indicates an order for reading out said interruption test pattern information from said interruption pattern memory;
   an interruption address expansion unit that generates an address of said interruption test pattern information in said interruption pattern memory according to said interruption vector instruction stored in said interruption vector memory;
   a pattern generating unit that generates said test pattern based on said test pattern information corresponding to said address generated by said address expansion unit or said interruption test pattern information corresponding to said address generated by said interruption address expansion unit;
   a pin data selector that rearranges said test pattern generated by said pattern generating unit according to a pin arrangement of electric terminals of said electric part;
   a waveform formatter that formats a waveform of said input test pattern, which is included in said test pattern output from said pin data selector;
   a device socket that provides said input test pattern formatted by said waveform formatter to said electric part and receives an output signal output from said electric part; and
   a comparator that compares said output signal, which is received by said device socket, with said expected value.

13. An electric part testing apparatus as claimed in claim 12, further comprising:
- an interruption detecting unit that detects a point in time for starting said interruption process; and
- said interruption address expansion unit generates said address of said interruption test pattern information based on detection of said point in time for starting said interruption process by said interruption detecting unit; and
- said pattern generating unit generates said test pattern based on said test pattern information corresponding to said address generated by said address expansion unit when said interruption detecting unit does not detect said point in time for starting said interruption process, and said pattern generating unit generates said test pattern based on said interruption test pattern information corresponding to said address generated by said interruption address expansion unit when said interruption detecting unit detects said point in time for starting said interruption process.

14. An electric part testing apparatus as claimed in claim 13, further comprising:
- an interruption controller that interrupts generation of said address generated by said address expansion unit based on detection of said point in time for starting said interruption process by said interruption detecting unit;
- an interruption end detecting unit that detects an end of said interruption process; and
- a starting controller that starts generation of said address by said address expansion unit based on detection of said end of said interruption process by said interruption end detecting unit.

15. An electric part testing apparatus as claimed in claim 13, wherein said electric part is a memory having a function of storing data and which requires refreshing in order to hold said data, and
- said interruption pattern memory stores said interruption test pattern information, which defines a test pattern for refreshing said memory.

16. An electric part testing apparatus as claimed in claim 15, wherein said interruption pattern memory further stores said interruption test pattern information that defines a test pattern for pre-charging said memory and a test pattern for providing a column address, which is provided to said memory before executing said interruption process, to said memory;
- said pattern generating unit generates said test pattern in an order of: said test pattern for pre-charging said memory, said test pattern for refreshing said memory, and said test pattern for providing said column address to said memory when said interruption detecting unit detects said point in time for starting said interruption process.

17. A method for generating a test pattern used for testing an electric part including:
- generating test pattern information, which defines said test pattern;
- generating a vector instruction, which indicates an order for reading out said test pattern information;
- generating an address of said test pattern information according to said vector instruction;
- generating interruption test pattern information, which defines said test pattern during a predetermined interruption process;
- generating an interruption vector instruction, which indicates an order for reading out said interruption test pattern information;
- generating an address of said interruption test pattern information according to said interruption vector instruction; and
- generating said test pattern based on said test pattern information corresponding to said address generated by said generating said address of said test pattern information or said interruption test pattern information corresponding to said address generated by said generating said address of said interruption test pattern information.

* * * * *